(12) United States Patent
Yoshihara et al.

(10) Patent No.: US 10,289,004 B2
(45) Date of Patent: *May 14, 2019

(54) DEVELOPING APPARATUS, DEVELOPING METHOD AND STORAGE MEDIUM

(71) Applicant: TOKYO ELECTRON LIMITED, Tokyo (JP)

(72) Inventors: Kousuke Yoshihara, Koshi (JP); Hideharu Kyouda, Koshi (JP); Koshi Muta, Koshi (JP); Taro Yamamoto, Koshi (JP); Yasushi Takiguchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 46 days.

This patent is subject to a terminal disclaimer.

(21) Appl. No.: 15/338,638

(22) Filed: Oct. 31, 2016

(65) Prior Publication Data

US 2017/0045821 A1   Feb. 16, 2017

Related U.S. Application Data

(62) Division of application No. 14/450,704, filed on Aug. 4, 2014, now Pat. No. 9,575,411.

(30) Foreign Application Priority Data

Aug. 5, 2013  (JP) ................................. 2013-162611

(51) Int. Cl.
*G03F 7/30* (2006.01)
*B05D 3/12* (2006.01)
(Continued)

(52) U.S. Cl.
CPC .............. *G03F 7/30* (2013.01); *B05C 5/0287* (2013.01); *B05C 11/08* (2013.01); *B05D 1/005* (2013.01);
(Continued)

(58) Field of Classification Search
CPC ......... G03F 7/30; G03F 7/3021; B05D 1/005; B05D 1/26; B05C 11/08; B05C 5/0287; B05C 5/02; H01L 21/6715
(Continued)

(56) References Cited

U.S. PATENT DOCUMENTS 6,265,323 B1   7/2001  Nakamura et al.
6,602,382 B1   8/2003  Matsuyama et al.
(Continued)

FOREIGN PATENT DOCUMENTS

JP   60-140350 A1   7/1985
JP   11-329960 A1   11/1999
(Continued)

OTHER PUBLICATIONS

Korean Office Action (with English translation), Korean Application No. 10-2014-0083636, dated Jan. 14, 2019.

*Primary Examiner* — Kirsten Jolley
(74) *Attorney, Agent, or Firm* — Burr & Brown, PLLC

(57) ABSTRACT

A developing apparatus includes: a substrate holder that hold a substrate horizontally; a developer nozzle that supplies a developer onto the substrate to form a liquid puddle; a turning flow generation mechanism including a rotary member that rotates about an axis perpendicular to the substrate while the rotary member is being in contact with the liquid puddle thereby to generate a turning flow in the liquid puddle of the developer formed on the substrate; and a moving mechanism for moving the turning flow generation mechanism along a surface of the substrate. The line-width uniformity of a pattern can be improved by forming turning flows in a desired region of the substrate and stirring the developer.

8 Claims, 39 Drawing Sheets

(51) Int. Cl.
  *B05C 11/08* (2006.01)
  *B05D 1/00* (2006.01)
  *H01L 21/67* (2006.01)
  *B05C 5/02* (2006.01)
  *B05D 1/26* (2006.01)

(52) U.S. Cl.
  CPC ........ *G03F 7/3021* (2013.01); *H01L 21/6715*
    (2013.01); *B05C 5/02* (2013.01); *B05D 1/26*
    (2013.01)

(58) Field of Classification Search
  USPC .......................................... 427/240; 430/434
  See application file for complete search history.

(56) References Cited

U.S. PATENT DOCUMENTS

| | | |
|---|---|---|
| 6,982,002 B2 | 1/2006 | Tanaka et al. |
| 9,568,829 B2 * | 2/2017 | Yoshihara ................ G03F 7/30 |
| 2001/0014536 A1 | 8/2001 | Nakamura et al. |
| 2010/0130107 A1 | 5/2010 | Yilmaz et al. |
| 2011/0096304 A1 | 4/2011 | Takeguchi et al. |
| 2012/0073609 A1 | 3/2012 | Hashimoto et al. |

FOREIGN PATENT DOCUMENTS

| | | |
|---|---|---|
| JP | 2000-173906 A1 | 6/2000 |
| JP | 2002-239434 A | 8/2002 |
| JP | 3614769 B2 | 1/2005 |
| JP | 4893799 B2 | 3/2012 |
| JP | 2012-074589 A1 | 4/2012 |

* cited by examiner

DEVELOPING APPARATUS, DEVELOPING METHOD AND STORAGE MEDIUM

CROSS REFERENCE TO RELATED APPLICATIONS

This application is a divisional of U.S. patent application Ser. No. 14/450,704, filed Aug. 4, 2014, and claims the benefit under 35 USC § 119(1)-(d) of Japanese Patent Application No. 2013-162611 filed on Aug. 5, 2013, the entire contents of which are incorporated herein by reference.

FIELD OF THE INVENTION

The present invention relates to a developing apparatus for developing a substrate after exposure, a developing method, and a storage medium used for the developing apparatus.

BACKGROUND ART

In a photolithography process for manufacturing of a semiconductor device, a developer is supplied to a substrate, on which a resist film has been formed and which has been exposed with a predetermined pattern, so that a resist pattern is formed on the substrate. The developing process is sometimes performed using a method, in which a puddle of a developer is formed on the entire substrate by moving a nozzle having an elongate discharge opening from one end to the other end of the substrate while discharging the developer from the discharge opening. Since the puddle is formed while the substrate is under a stationary state, this developing method is referred to as "stationary developing method". Japanese Patent No. 3614769 (JP 3614769 B2) describes an example of the stationary developing method. There is another developing method that rotates a substrate and moves a nozzle so as to move a developer supplying position radially on a rotating substrate. Due to the movement of the developer supplying position and a centrifugal force, a liquid film of the developer is formed on the substrate and the developer forming the liquid film flows. Japanese Patent No. 4893799 (JP 4893799 B2) describes an example of the rotary developing method.

In the stationary developing method, the liquid puddle sometimes fluctuates due to various factors, such as gas flows in a circumstance where the liquid puddle is formed, and vibrations of a driving mechanism connected to a substrate holder for holding the substrate. Due to the fluctuation, concentration of the developer near the resist film may vary in various locations within the plane of the substrate, resulting in fluctuation in the reaction of the resist film and the developer. As a result, CPU (Critical Dimension Uniformity) of CD (Critical Dimension) which is the line width of the pattern in one exposure region (shot) within the wafer plane may be deteriorated.

In the rotary developing method, since the developer flows and is stirred on the substrate, CDU in the exposure region can be higher than that in the stationary developing method. However, in the rotary developing method, a developer supplied to the substrate flows on the surface of a resist film, during which the developer reacts with the resist so that the concentration of the developer changes. That is, CD may vary in the flowing direction of the developer. A technique capable of achieving a higher CDU is thus desired. Japanese patent laid-open publication No. JP2012074589A discloses a technique that brings the lower end of a nozzle disposed above a central portion of a substrate into contact with a processing liquid supplied from the nozzle and rotating the substrate thereby forming a liquid film on the substrate. This technique, however, is not capable of solving the foregoing problem.

SUMMARY OF THE INVENTION

The embodiments of the present invention intend to provide a technique that improves the line-width uniformity, of a resist pattern, within a plane of a substrate, when a developing process is performed to an exposed substrate.

A developing apparatus in one embodiment of the present invention includes a substrate holder that hold a substrate horizontally; a developer nozzle that supplies a developer onto the substrate to form a liquid puddle; a turning flow generation mechanism including a rotary member that rotates about an axis perpendicular to the substrate while the rotary member is being in contact with the liquid puddle thereby to generate a turning flow in the liquid puddle of the developer formed on the substrate; and a moving mechanism that moves the turning flow generation mechanism along a surface of the substrate.

A developing method in another embodiment of the present invention includes: holding a substrate horizontally by a substrate holder; supplying a developer from a developer nozzle to the substrate thereby forming thereon a liquid puddle; generating a turning flow in the liquid puddle to stir the liquid puddle; and moving a position where the turning flow was generated.

According to the above embodiments, turning flows can be generated to desired regions of the substrate and the developer can be stirred to improve the developer concentration uniformity. As a result, the line-width uniformity of the resist pattern is improved in a region where the turning flows are formed. Accordingly, the line-width uniformity within the plane of the substrate can be improved.

DESCRIPTION OF EMBODIMENTS

<First Embodiment>

Figure 1:
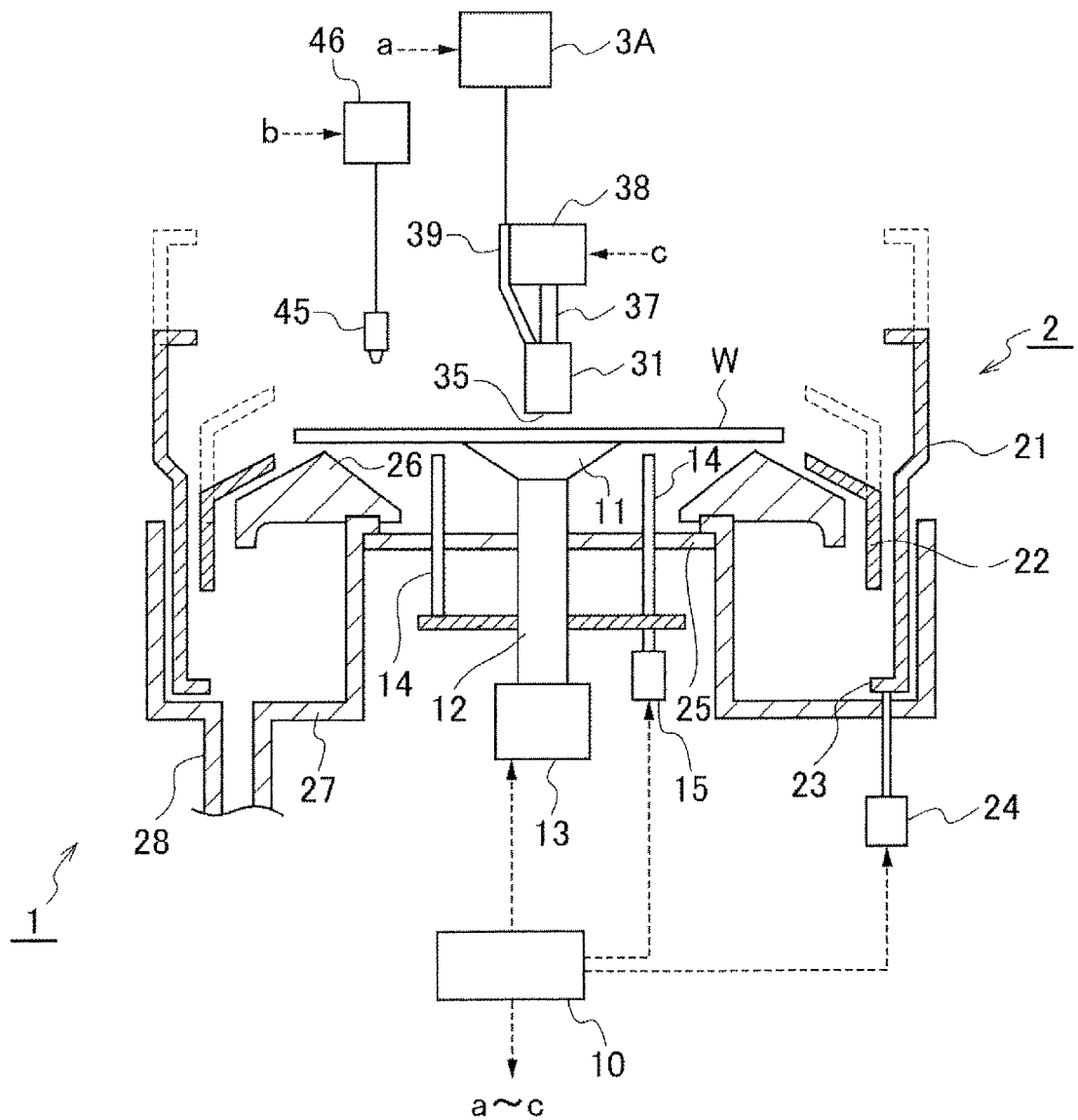
FIG. 1 is a vertical cross sectional view schematically showing a developing apparatus in one embodiment of the present invention.
Figure 2:
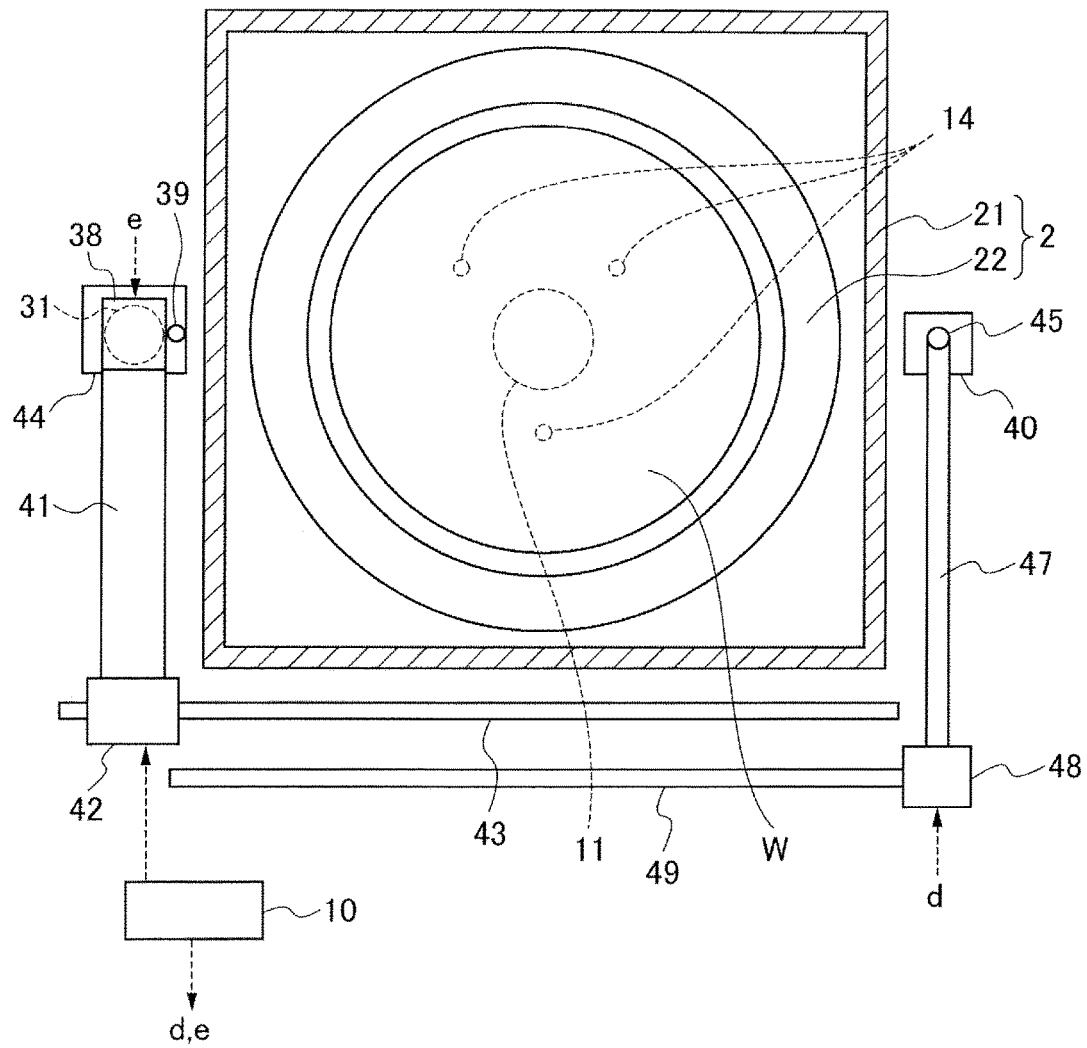
FIG. 2 is a top plan view of the developing apparatus.

FIGS. 1 and 2 show a developing apparatus 1 according to a first embodiment of the present invention. A wafer W having a resist film formed on its surface is transferred to the developing apparatus 1 and is processed therein. The resist film has been exposed with a predetermined pattern. The developing apparatus 1 includes a spin chuck 11 serving as a substrate holder. The spin chuck 11 is configured to absorb (suck) a central portion of the rear surface of the wafer W such that the wafer W is held horizontally. The spin chuck 11 is connected to a rotating and driving unit 13 disposed below through a rotating shaft 12.

The developing apparatus 1 is provided with a cup body 2 which surrounds the wafer W held by the spin chuck 11. The cup body 2 is composed of an outer cup 21 and an inner cup 22. An upper side of the cup body 2 is opened. An upper part of the outer cup body 21 has a rectangular shape, while a lower part thereof has a cylindrical shape. The reference number 23 depicts a stepped part formed on a lower part of the outer cup 21, and 24 depicts an elevation unit connected to the stepped part 23. The inner cup 21 has a cylindrical shape, and an upper part thereof inclines inward. When the stepped part 23 is brought into contact with a lower end surface of the inner cup 22 during elevation of the outer cup 21, the inner cup 22 is moved upward. When a developer is removed from the wafer W, the cup body 2 is elevated as shown by the dotted lines, so as to receive the liquid scattering from the wafer W.

A circular plate 25 is disposed below the wafer W held by the spin chuck 11. A ring-shaped guide member 26 having a cross section of a chevron shape is disposed outside the circular plate 25. The guide member 26 guides the developer and a cleaning liquid falling down from the wafer W to a liquid receiving part 27 disposed outside the circular plate 25. The liquid receiving part 27 is an annular recessed part. The reference number 28 depicts a drain pipe, which is connected to the liquid receiving part 27. The drain pipe 28 is connected to a drain tank (not shown). A vapor-liquid separator (not shown) is disposed on the drain pipe 28, so that vapor to be exhausted and liquid to be drained are separated from each other. The reference number 15 depicts an elevation mechanism for moving a pin 14 upward or downward. With the aid of the upward and downward movement of the pin 14, the wafer W can be transferred between a substrate transfer mechanism (not shown) and the spin chuck 11.

Figure 3:
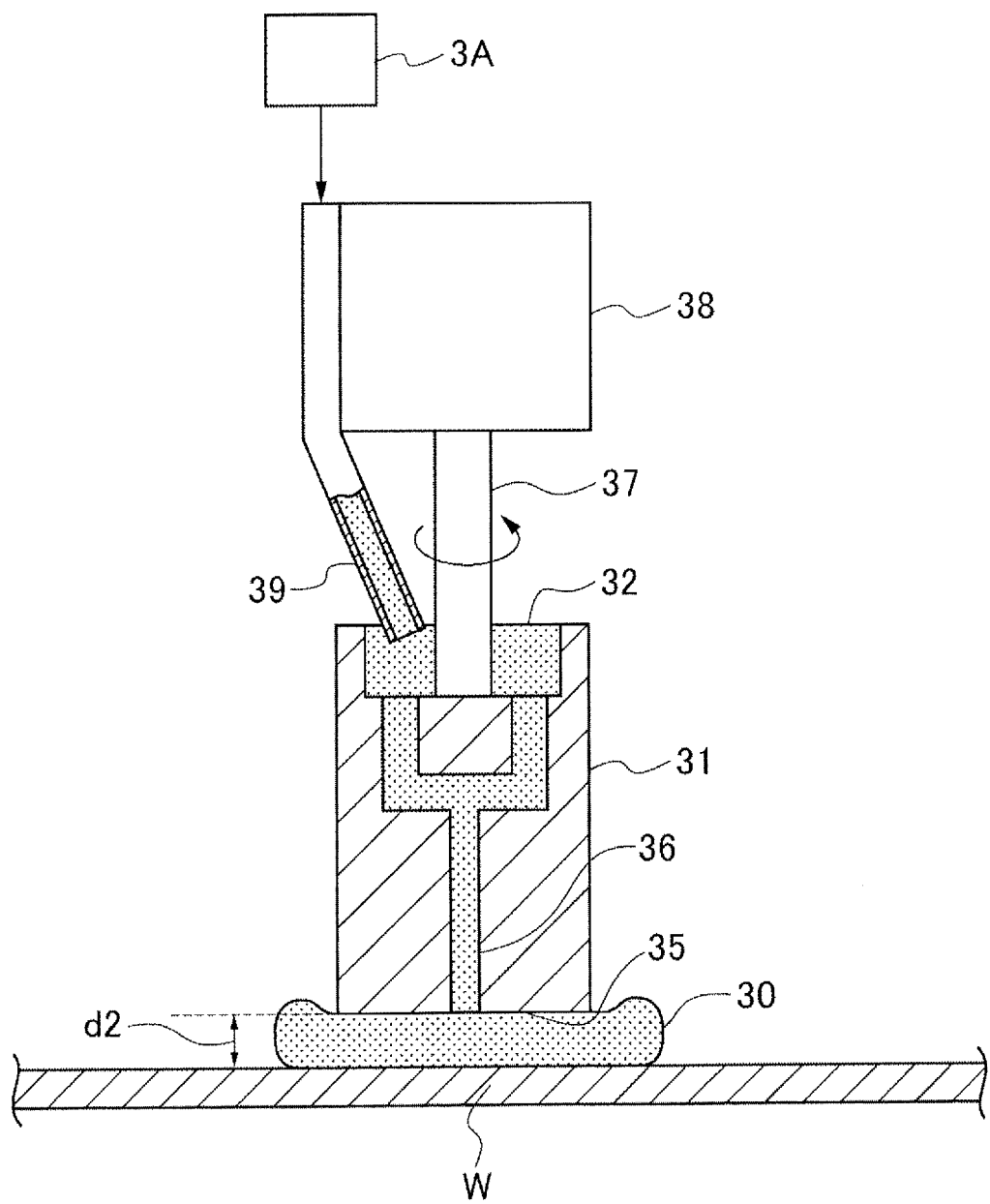
FIG. 3 is a vertical cross sectional view schematically showing a developer nozzle provided in the developing apparatus.
Figure 4:
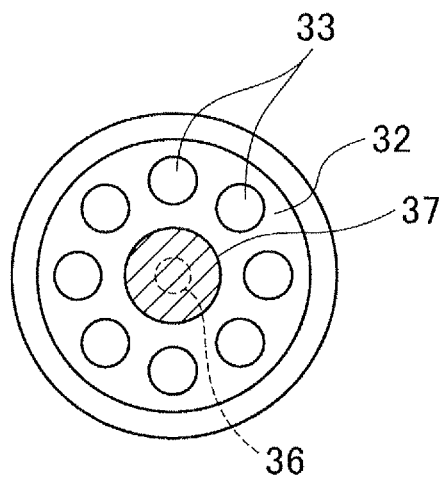
FIG. 4 is a top plan view of the nozzle.
Figure 5:
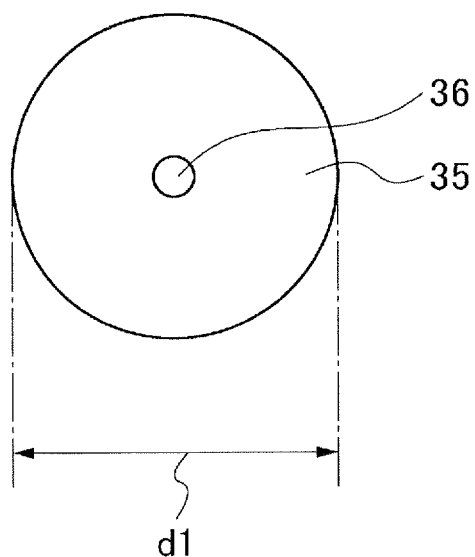
FIG. 5 is a bottom plan view of the nozzle.

The developing apparatus 1 includes a developer nozzle 31. The developer nozzle 31 has a function for supplying the developer to the wafer W so as to form a liquid puddle thereon, and a function for generating a turning flow in the liquid puddle. That is, the developer nozzle 31 has not only a function as a nozzle but also has a function as a turning-flow generating mechanism. FIG. 3 is a longitudinal sectional view of the developer nozzle 31. FIGS. 4 and 5 are a top plan view and a bottom plan view of the developer nozzle 31, respectively. The developer nozzle 31 has a columnar shape elongated in the vertical direction. A recessed part 32 is formed in a top surface of the developer nozzle 31. In a bottom surface of the recessed part 32, a plurality of apertures 33 are opened around a center axis of the developer nozzle 31. Each aperture 33 is connected to a discharge opening 36 that is opened perpendicularly to a central part of a bottom surface 35 of the developer nozzle 31.

The bottom surface 35 is circular, and is formed to be in parallel with the wafer W placed on the spin chuck 11. The discharge opening 36 is opened in a central axis of the developer nozzle 31, i.e., in a central portion of the bottom surface 35. A diameter d1 of the bottom surface 35 is smaller than a diameter of the wafer W. The diameter of the wafer W is, for example, 450 mm, but a wafer W having a smaller diameter may be used. When the diameter of the wafer W is larger, it can be expected that the aforementioned problems such as an amount of the developer to be consumed, a liquid spattering and a throughput can be greatly improved. A resin is used for a material of the developer nozzle 31, for example, in order to stir the developer by a surface tension, which will be described below. As the resin, PFA (tetrafluoroethylene-perfluoroalkylvinylether copolymer) or PTFE (polytetrafluoroethylene) is used, for example.

A shaft 37 extends vertically upward from a bottom surface of the recessed part 32 along the central axis of the developer nozzle 31. The upper end of the shaft 37 is connected to a rotating mechanism 38. The rotating mechanism 38 allows the developer nozzle 31 to rotate about the central axis. Namely, the developer nozzle 31 rotates about the discharge opening 36. The downstream end of a developer supply pipe 39 is opened to the recessed part 32, so that the developer supplied from the developer supply pipe 39 to the recessed part 32 is discharged onto the wafer W from the discharge opening 36. The downstream end of the developer supply pipe 39 is fixed onto the rotating mechanism 38. The reference number 3A depicts a developer supply source, which is connected to the upstream end of the developer supply pipe 39. The developer supply source 3A has a pump, a valve and so on, and supplies the developer to the developer nozzle 31 in accordance with control signals sent from a below-described control unit 10.

As shown in FIG. 3, when the wafer W is subjected to the developing process, the bottom surface 35 of the developer nozzle 31 opposed in proximity to the wafer W. At this time, the distance d2 between the surface of the wafer W and the bottom surface 35 of the developer nozzle 31 is, for example, 0.5 mm to 2 mm. Since the developer is discharged onto the wafer W from the discharge opening 36, with the bottom surface 35 is placed in proximity to the wafer W, a liquid puddle 30 that contacts with the bottom surface 35 is formed below the developer nozzle 31.

Figure 6:
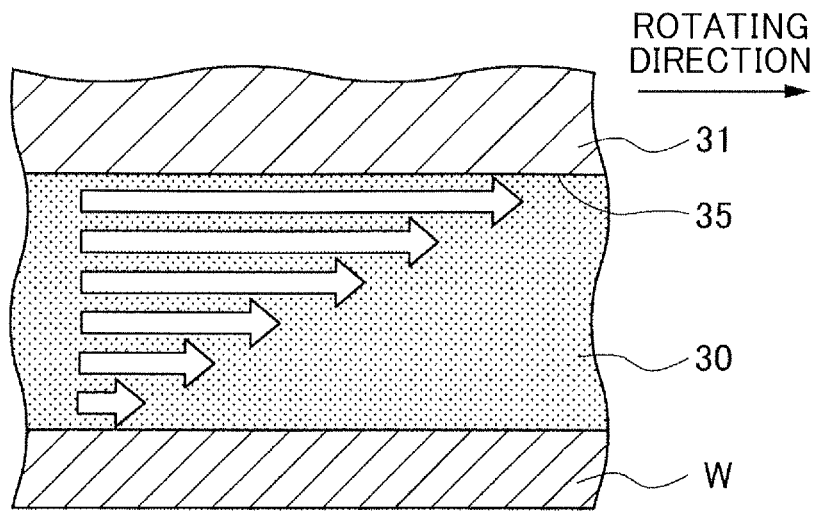
FIG. 6 is a schematic diagram of a liquid puddle below the nozzle.
Figure 7:
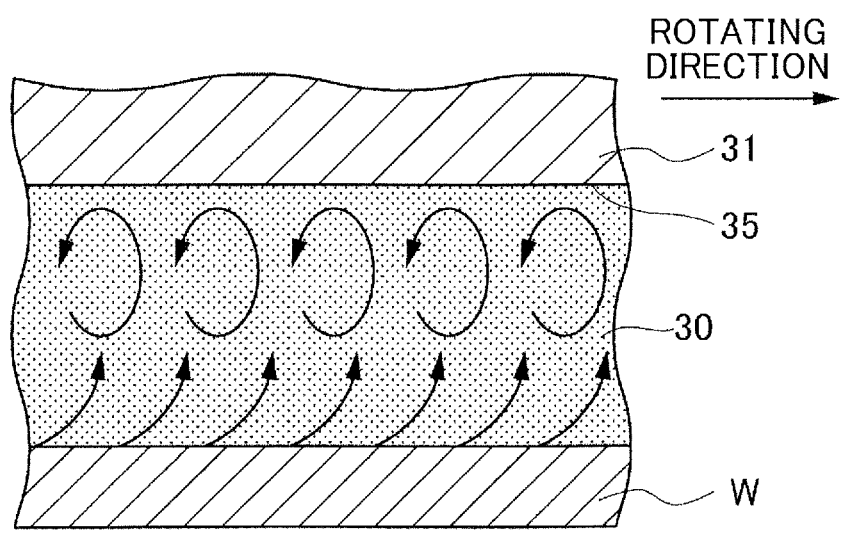
FIG. 7 is a schematic diagram of the liquid puddle below the nozzle.
Figure 8:
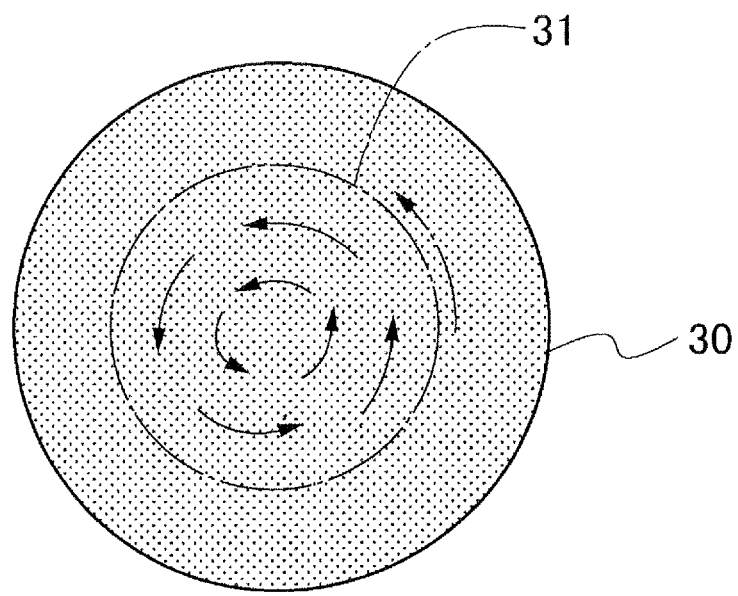
FIG. 8 is a plan view of the liquid puddle.

Under the state in which the liquid puddle 30 is formed, the developer nozzle 31 is rotated about the central axis by the rotating mechanism 38. FIGS. 6 and 7 are side views showing the condition of the liquid puddle 30 when the developer nozzle 31 is rotated. A surface tension acts between the liquid puddle 30 and the bottom surface 35 of the developer nozzle 31, so that the liquid puddle 30 and the bottom surface 35 pull against each other. When the developer nozzle 31 is rotated, a force urging the liquid puddle 30 to rotate is applied to the liquid puddle 30 via the surface tension. Thus, as shown by the arrow in FIG. 6, a liquid flow along the rotating direction of the developer nozzle 31, i.e., a turning flow is generated. FIG. 8 shows the turning flow as viewed from above. In FIG. 8, the rotating direction of the developer nozzle 31 is shown by the dotted line arrow, and the direction in which the developer flows in the liquid puddle 30 is shown by the solid line arrows.

As shown by the arrows in FIG. 7, since the turning flow is generated so that the developer is stirred under the developer nozzle 31, the developer concentration uniformity becomes higher. In detail, even though the resist and the developer react with each other on the surface of the wafer W so that the concentration of the developer on the surface of the wafer W lowers, the developer of a lower concentration draws apart from the surface of the wafer W because the developer is stirred. Thus, a developer of a higher concentration, which has not reacted with the resist, is supplied to the surface of the wafer W. As a result, the reaction between the developer and the resist is promoted. In addition, the developer concentration uniformity in a specific area, within the plane of the wafer W, located below the bottom surface 35 of the developer nozzle 31 becomes high, and thus the reaction between the resist and the developer proceeds uniformly. That is to say, CD uniformity in the resist pattern is improved.

In the developing apparatus 1, the developer nozzle 31 is horizontally moved as described below, in order that the liquid puddle 30 is spread from the central portion to the peripheral portion of the wafer W. Simultaneously with the horizontal movement of the developer nozzle 31, the wafer W is rotated. Thus, the bottom surface 35 of the developer nozzle 31 is caused to pass through the whole surface of the wafer W, so that the developer over the whole surface of the wafer W is stirred. The diameter d1 of the bottom surface 35 of the developer nozzle 31, the rotating speed of the wafer W, the horizontal moving speed of the developer nozzle 31 are set such that the bottom surface 35 of the developer nozzle 31 can pass through the entire surface of the wafer W. The horizontal moving speed of the developer nozzle 31 is 10 mm/second to 100 mm/second, for example. The diameter d1 of the bottom surface 35 is 50 mm to 200 mm, for example. The rotating speed of the wafer W is preferably not more than 100 rpm and more preferably 10 rpm to 50 rpm, in order to prevent liquid spattering upon discharge of the developer onto the wafer W. In addition, in order to sufficiently stir the developer, the rotating speed of the developer nozzle 31 is 50 rpm to 1000 rpm, for example.

Returning to FIG. 2, the developing apparatus 1 is described. The rotating mechanism 38 is fixed on the distal end of an arm 41, while the proximal end of the arm 41 is connected to a moving mechanism 42. The arm 41 is moved upward and downward by the moving mechanism 42. The moving mechanism 42 is moved along a horizontally-extending guide rail 43 to move the developer nozzle 31 along the radius of the wafer W held by the spin chuck 11. The reference number 44 depicts a waiting (stand-by) area of the developer nozzle 31, which is located outside the cup body 2.

In FIGS. 1 and 2, the reference number 45 depicts a cleaning liquid nozzle, which supplies a cleaning liquid (e.g., deionized water) to the wafer W so as to clean the wafer W. In FIG. 1, the reference number 46 depicts a cleaning liquid supply source, which has a pump, a valve and so on, and supplies the cleaning liquid in accordance with control signals from the control unit 10. In FIG. 2, the reference number 47 depicts an arm for supporting the cleaning liquid nozzle 45. The reference number 48 depicts a moving mechanism, which moves the arm 47 upward and downward, and is laterally moved along a guide rail 49. The reference number 40 depicts a waiting (stand-by) area of the cleaning liquid nozzle 45, which is located outside the cup body 2.

The developing apparatus 1 is provided with the control unit 10 comprising a computer. The control unit 10 includes a program storing unit, not shown. The program storing unit stores a program as software, for example, including instructions for carrying out a developing process which is described below. When the program is read out by the control unit 10, the control unit 10 outputs control signals to the component part of the developing apparatus 1. Thus, the respective operations, such as the movement of the developer nozzle 31 by the moving mechanism 42, the movement of the cleaning liquid nozzle 45 by the moving mechanism 48, the rotation of the developer nozzle 31 by the rotating mechanism 38, the supply of the developer to the developer nozzle 31 by the developer supply source 3A, the supply of the cleaning liquid to the cleaning liquid nozzle 45 by the cleaning-liquid supply source 46, the rotation of the wafer W by the spin chuck 11, the upward and downward movement of the pin 14, are controlled, whereby the wafer W is subjected to the developing process and the cleaning process, as described below. The program is stored in the program storing unit, under a state in which the program is stored in a storage medium such as a hard disc drive, a compact disc, a magnet optical disc, or a memory card.

Figure 14:
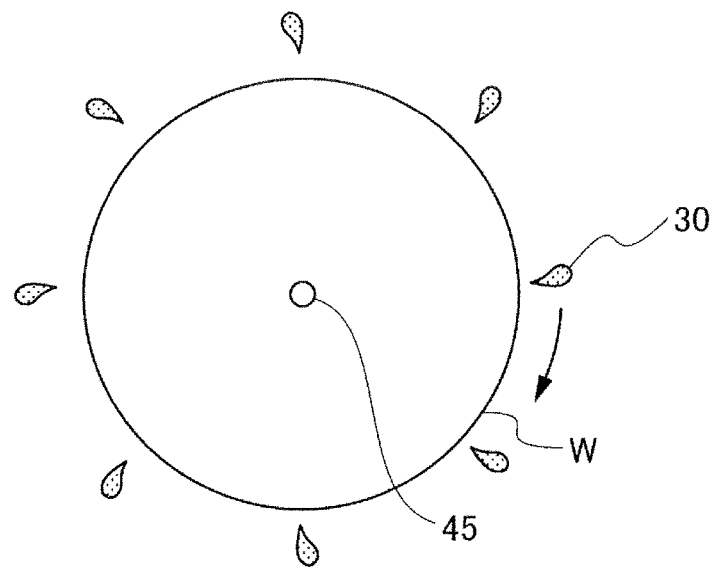
FIG. 14 illustrates yet another process step in the first embodiment.
Figure 15:
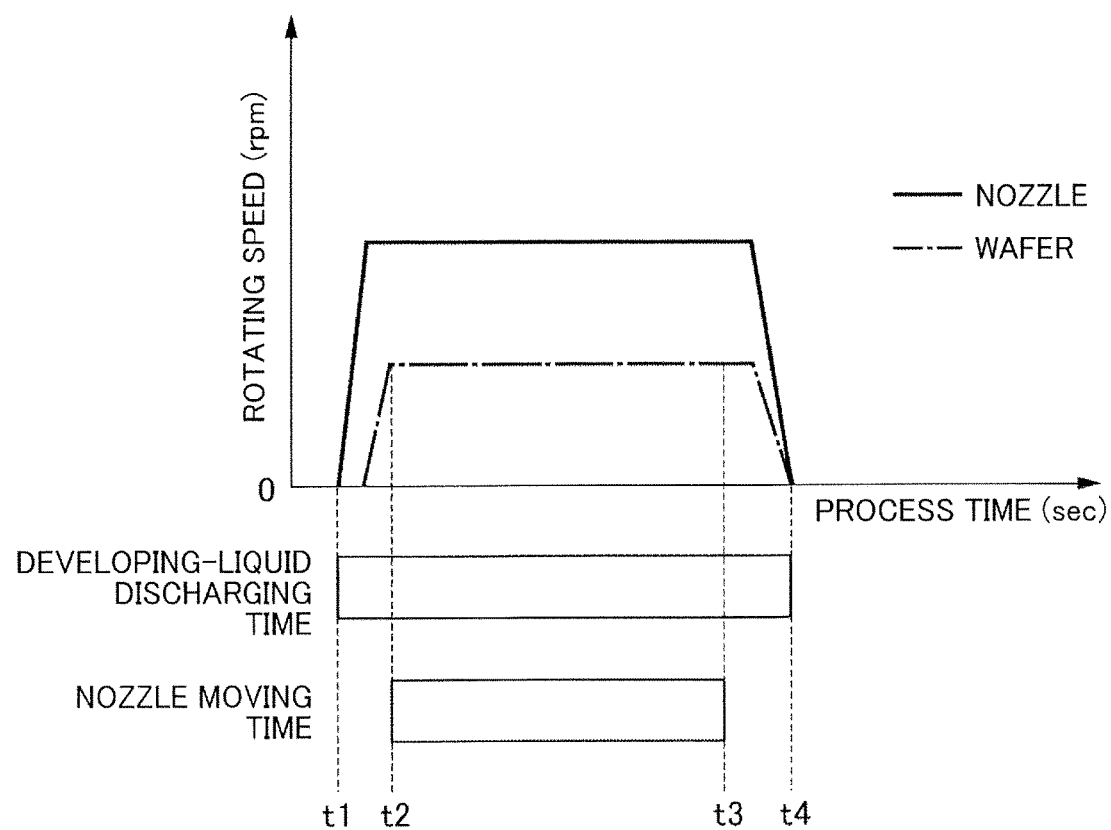
FIG. 15 is a time chart of the process steps of FIGS. 9 to 14.

The procedures of the developing process and the cleaning process performed by using the developing apparatus 1 are explained with reference to operational views of the developing apparatus 1 shown in FIGS. 9 to 14. A time chart in FIG. 15 is also referred to as needed basis. This time chart shows the relationship between the time (process time) elapsed from the start of the developing process, and the rotating speed of the developer nozzle 31 and the rotating speed of the wafer W. The solid line graph shows the rotating speed of the developer nozzle 31 and the one-dot chain line graph shows the rotating speed of the wafer W, respectively. In this time chart, the period in which the developer is discharged from the developer nozzle 31, and the period in which the developer nozzle 31 is moved during the discharge of the developer are shown by bars, respectively.

Figure 9:
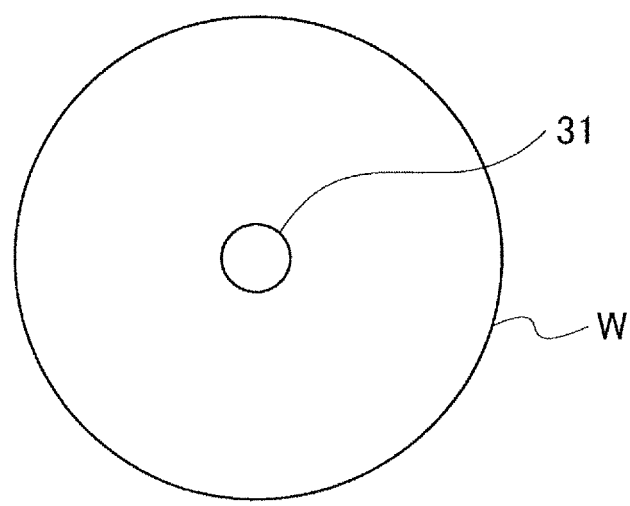
FIG. 9 illustrates a process step in a first embodiment.
Figure 10:
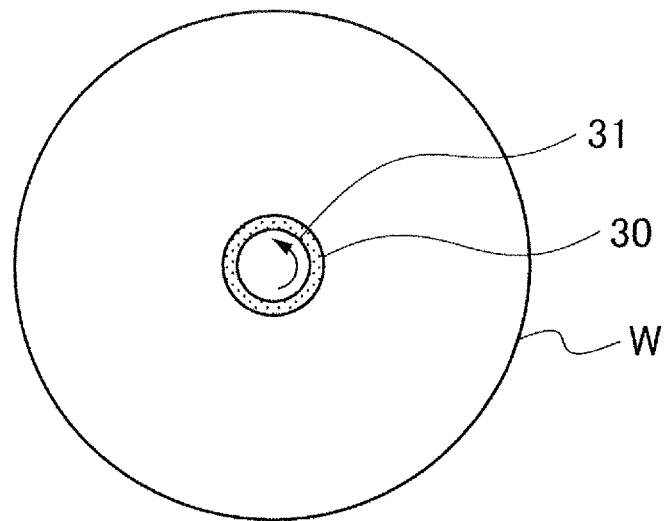
FIG. 10 illustrates another process step in the first embodiment.

Firstly, a wafer W is transferred to the developing apparatus 1 by the substrate transfer mechanism (not shown), and is held by the spin chuck 11. Then, the developer nozzle 31 is moved from the waiting area 44 to a position above the central portion of the wafer W, and is moved downward such that the bottom surface 35 comes close to the wafer W, which has been described with reference to FIG. 3 (FIG. 9). Following thereto, the developer is supplied from the developer nozzle 31 to the wafer W, and the developer nozzle 31 is rotated counterclockwise in a plan view (time point t1 in the chart of FIG. 15). Thus, the liquid puddle 30 larger than the bottom surface 35 is formed between the bottom surface 35 of the developer nozzle 31 and the wafer W, and contacts with bottom surface 35. Then, a turning flow is generated in the liquid puddle 30, which has been described with reference to FIGS. 6 to 8, whereby the developer below the bottom surface 35 is stirred (FIG. 10).

Figure 11:
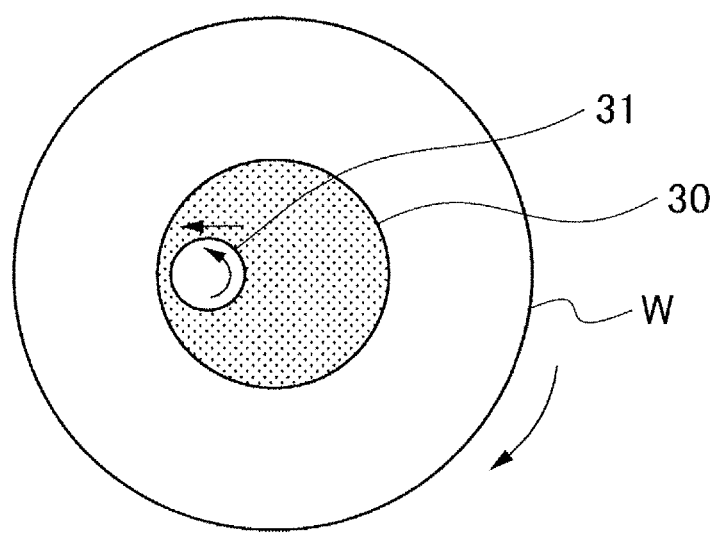
FIG. 11 illustrates yet another process step in the first embodiment.

When the rotating speed of the developer nozzle 31 increases to reach a predetermined one, the developer nozzle 31 is continuously rotated at the predetermined rotating speed. After that, the wafer W is rotated clockwise in plan view, while a rotating speed thereof increases. When the rotating speed of the wafer W reaches 10 rpm, for example, the wafer W is continuously rotated at the rotating speed of 10 rpm, and the developer nozzle 31 starts to move at 10 mm/second, for example, toward the peripheral portion of the wafer W along the surface of the wafer W on the radius thereof (time point t2). Thus, the liquid puddle 30 is spread out toward the peripheral portion of the wafer W, while the liquid puddle 30 is in contact with the bottom surface 35 of the developer nozzle 31 (FIG. 11). The developer nozzle 31 may be rotated in the same rotating direction as the wafer, in which case the developer stirring effect and improved developer concentration uniformity are also achieved.

The rotating developer nozzle 31 moves continuously over the wafer W so as not to overtake the spreading liquid puddle 30. The reason why the developer nozzle 31 should not overtake the liquid puddle 30 is that, if the developer nozzle 31 overtakes the liquid puddle 30, a plurality of liquid puddles 30 are formed on the surface of the wafer W. That is, the developer puddle separation occurs on the surface of the wafer W. The individual liquid puddles 30 will then independently spread on the surface of the wafer W, and interfaces (surfaces) of these liquid puddles 30 will merge together. Due to the influence of the merging action, the CD of the resist pattern where the merging occurred may be different from that of the resist pattern in another location. That is to say, the CDU (Critical Dimension Uniformity) of the resist pattern within the plane of the wafer may be degraded. For this reason, the moving speed of the developer nozzle 31 is set such that the developer nozzle 31 does not overtake the liquid puddle 30.

Figure 12:
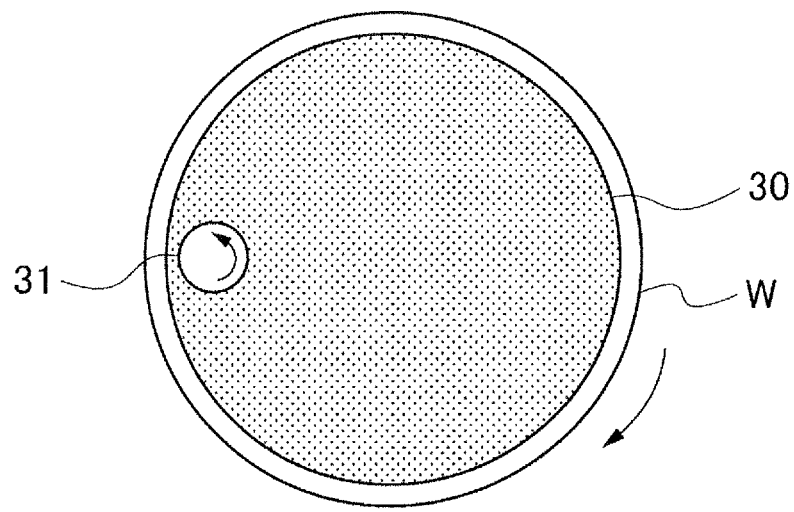
FIG. 12 illustrates yet another process step in the first embodiment.
Figure 13:
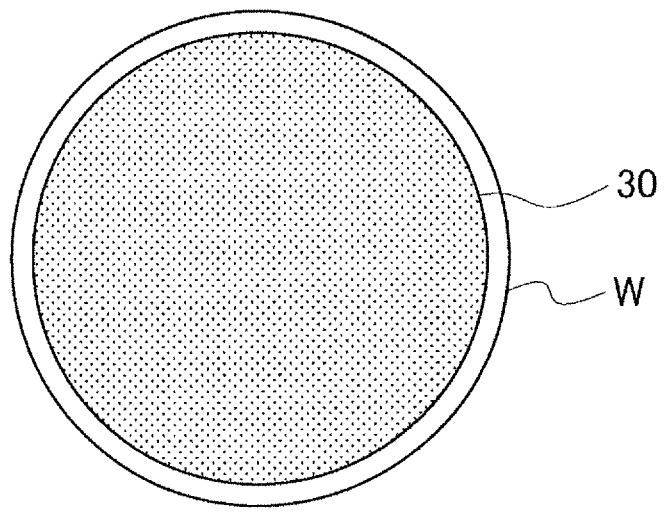
FIG. 13 illustrates yet another process step in the first embodiment.

Below the liquid puddle 30 that is spreading toward the peripheral portion of the wafer W, the reaction between the resist film on the surface of the wafer W and the developer forming the liquid puddle 30 proceeds. As described above, the developer of the liquid puddle 30 below the developer nozzle 31 is stirred by the turning flow, whereby the developer concentration becomes uniform. When the developer nozzle 31 is moved to a position above the peripheral portion of the wafer W so that the whole surface of the wafer W is covered by the developer, the movement of the developer nozzle 31 is stopped (time point t3, FIG. 12). The wording "the whole surface of the wafer W" is intended to mean all the areas in which the resist pattern is formed. For example, if a wafer W has a peripheral portion not provided with the resist pattern, it is not necessary to form a liquid puddle of the developer on such a peripheral portion of the wafer W. Although FIG. 12 shows an example in which the liquid puddle 30 is formed slightly inside the peripheral edge of the wafer W, the wafer W may be coated with the liquid puddle 30 up to the peripheral edge.

Figure 16:
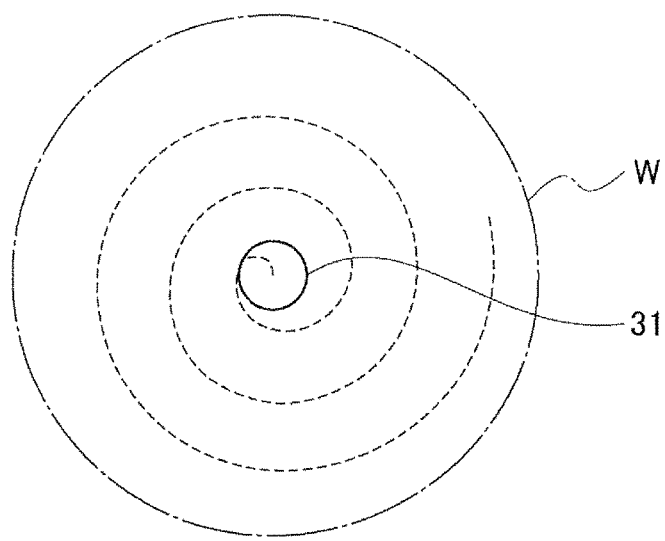
FIG. 16 is an explanatory diagram illustrating a moving path of the developer nozzle over a wafer.

As described above, until the liquid puddle 30 is formed over the whole surface of the wafer W, the developer nozzle 31 passes through the whole surface of the wafer W to stir the developer. FIG. 16 shows the route of the developer nozzle 31 a viewed from the upper surface of the wafer W. The dotted lines in FIG. 16 show a trajectory of the discharge opening 36 of the developer nozzle 31. After the movement of the developer nozzle 31 stops, the rotating speed of the developer nozzle 31 and the rotating speed of the wafer W decrease, and then their rotation stops (time point t4). For example, simultaneously with the stopping of the rotation of the developer nozzle 31, the supply of the developer from the developer nozzle 31 stops, and the developer nozzle 31 returns to the waiting area 44.

After the reaction between the resist film and the developer further proceeds on the whole surface of the wafer W by the stationary liquid puddle 30 existing on the wafer W (FIG. 13), the cleaning liquid nozzle 45 is positioned above the central portion of the wafer W and the wafer W is rotated at a predetermined rotating speed. A cleaning liquid is discharged onto the central portion of the wafer W. Then, the cleaning liquid spreads toward the peripheral portion of the wafer W by the centrifugal force, so that the liquid puddle 30 of the developer is removed from the wafer W (FIG. 14). After the discharge of the cleaning liquid stops, the wafer W is continuously rotated so that the cleaning liquid is spun off from the wafer W so that the wafer W is dried. Thereafter, the wafer W is unloaded from the developing apparatus 1 by the substrate transfer mechanism, not shown.

In the developing apparatus 1, the developer is discharged from the developer nozzle 31 toward the central portion of the wafer W such that the liquid paddle 30 of the developer contacting with the developer nozzle 31 is formed, and the turning flow is generated in the liquid puddle 30 by rotating the developer nozzle 31. Then, while the rotation of the developer nozzle 31 and the discharge of the developer are continued, the liquid puddle 30 of the developer spreads over the whole surface of the wafer W by moving the developer nozzle 31 toward the peripheral portion of the wafer W and by rotating the wafer W. After the developer nozzle 31 is moved to the position above the peripheral portion of the wafer W, the supply of the developer is stopped, whereby an amount of the developer falling down to the outside of the wafer W can be reduced. Thus, the consumption of the developer can be reduced. In addition, since the spreading of the developer is not dependent on the centrifugal force, the rotating speed of the wafer W may be lowered. Thus, spattering of the discharged developer on the wafer W due to rotation of the wafer W can be suppressed, and it is thus possible to avoid contamination of the wafer W by particles originated from the liquid spatters. In addition, since the developer below the developer nozzle 31 is stirred by the rotation of the developer nozzle 31, the unreacted resist and the unreacted developer are readily brought into contact with each other to promote the reaction therebetween, which improves the throughput.

In the stationary developing method which has been described in the "Background Art" section, after the formation of the puddle of the developer on the wafer W, there is a possibility that each portion of the puddle might fluctuate because of an environmental factor. In this case, the CD varies in the plane of the wafer W. In the rotary developing method, since the developer is stirred on the surface of the wafer W by the rotation of the wafer W, the CD variation caused by the fluctuation can be reduced. However, in the rotary developing method, the developer is supplied along the radial direction of the wafer W, the developer flows to a position distant from the position at which the developer has been supplied to the wafer W, and the flowing developer comes into contact with the resist so that the developer concentration varies. Thus, the CD may vary in the liquid flow direction of the developer. However, with the developing apparatus 1, the turning flow is generated locally below the developer nozzle 31 to stir the developer, and the rotation of the wafer W and the movement of the developer nozzle 31 are carried out such that the developer nozzle 31 passes through the whole surface of the wafer W. Thus, unlike the rotary developing method, the reaction between the resist and the developer can occur highly uniformly within the plane of the wafer W, without any variation in developer concentration within the plane of the wafer W due to the liquid flow of the developer. That is to say, according to the developing method employing the developing apparatus 1, the CD uniformity (CDU) within the plane of the wafer W is improved as compared with the stationary developing method and the rotary developing method.

It is supposed that a resist film whose contact angle against water is relatively high is formed on a wafer W, and the resist is exposed by immersion exposure. This means that the resist having unexposed portions whose contact angle remains high is subjected to the developing process. If this wafer W is developed by the stationary developing method, the developing process proceeds while the contact angle of the unexposed portions remains high. Thus, when the cleaning liquid (deionized water) is supplied after the developing process, there is a possibility that the cleaning liquid film may be broken into pieces because of the water repellency of the unexposed portions.

However, with the developing apparatus 1, during the spreading of the liquid puddle 30 toward the peripheral portion of the wafer W, the developer is stirred, whereby dissolved products produced by the dissolving of the resist spread toward the unexposed portions. When the unexposed portions come into contact with the dissolved products, the unexposed portions are hydrophilized. The breaking of the cleaning liquid film on the unexposed portion is thus prevented, and as a result, the defective development is prevented. In addition, since the developer is stirred, the developer "rakes" the dissolved product. It is thus possible to avoid defective development such as opening failure of the pattern in which the dissolved products remain as a residue on the resist pattern.

In addition, in the aforementioned developing method using the developing apparatus 1, the CD distribution within the plane of the wafer W can be adjusted by controlling the rotating speed of the developer nozzle 31 and/or the moving speed of the developer nozzle 31 at respective positions of the developer nozzle 31 above the wafer W. Since the CD distribution can be adjusted by controlling a few parameters, only a short time is required for the adjustment of the developing apparatus 1 in order to improve the CD uniformity within the plane of the wafer W.

Figure 17:
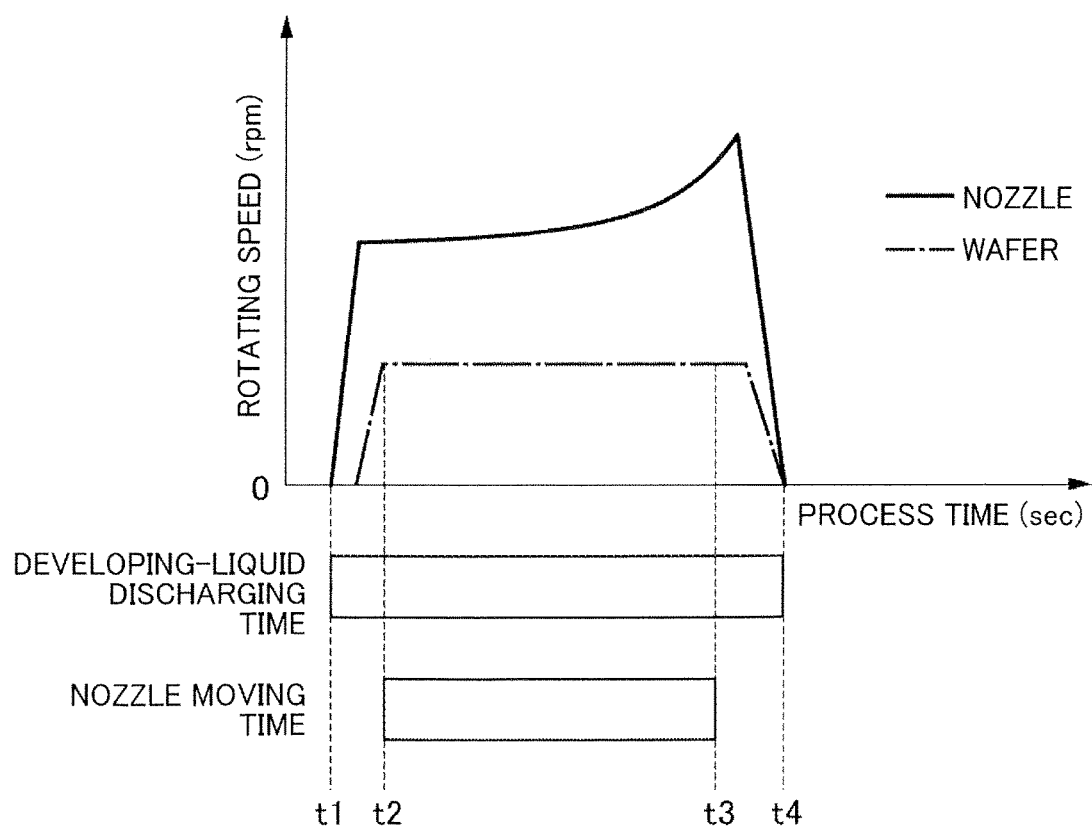
FIG. 17 is a time chart for a modification of the processes.

The developing process in one modification of the first embodiment is described. FIG. 17 shows a time chart for this modification, which differs from the time chart of FIG. 15 in the controlling of the rotating speed of the developer nozzle 31. In this modification, as the developer nozzle 31 moves from the central portion of toward the peripheral portion of the wafer W, the rotating speed of the developer nozzle 31 gradually increases. After the developer nozzle 31 reaches a position above the peripheral portion, the rotating speed continues to increase for a predetermined period of time. After that, the rotating speed decreases to stop the rotation of the developer nozzle 31. Except for the foregoing, the operations of the respective component parts are controlled in the same manner as the first embodiment.

Since the liquid puddle 30 spreads from the central portion toward the peripheral portion, the time period during which a portion of the wafer W is in contact with the developer becomes shorter according to the proximity to the peripheral edge of the wafer W. Thus, in this modification, the developer nozzle 31 is controlled such that the rotating speed thereof increases as it approaches the peripheral portion, so that the stirring of the developer is promoted and the reaction between the developer and the resist is thus promoted. That is, by controlling the rotating speed as described above, the CD uniformity in the plane of the wafer W can be further improved.

Although the wafer W is rotated in the first embodiment, in order to spread the liquid puddle 30 from the central portion toward the peripheral portion of the wafer W, such a rotation is not always necessary. In one modification, bottom surface 35 of the developer nozzle 31 is formed to have the same or larger size than that of the wafer W, and the bottom surface 35 is positioned close to the wafer W. The discharge opening 36 of the bottom surface 35 is located above the central portion of the wafer W. Then, the developer is supplied from the developer nozzle 31 and the developer nozzle 31 is rotated. The developer nozzle 31 is not moved laterally. Thus, while a turning flow is formed, the liquid puddle 30 is spread out from the central portion toward the peripheral portion of the wafer W, so that the developer is stirred over the whole surface of the wafer W. When the developer nozzle 31 is rotated, a turning liquid flow is generated in an area right below the bottom surface 35; and also in an area slightly outside the bottom surface 35, a turning liquid flow is generated which flows along with the turning liquid flow below the bottom surface 35. Thus, in a case where a turning flow is formed without rotating the wafer W and without laterally moving the developer nozzle 31 as mentioned above, the size of the bottom surface 35 of the developer nozzle 31 may be slightly smaller than the surface of the wafer W.

In the foregoing embodiment and the embodiments to be described later, the shape of the substrate to be processed by the developing apparatus 1 is not limited to circular, but maybe rectangle, for example. In the foregoing embodiment, the liquid puddle of the developer is formed on the wafer W. However, a process liquid which is to be supplied to the wafer W is not limited to a developer; a cleaning liquid may be supplied to the wafer W to form a liquid puddle like the developer so as to clean the wafer W.

In the first embodiment described above, in place of moving the developer nozzle 31 from the position above the central portion to the position above the peripheral portion of the wafer W, the developer nozzle 31 may be moved from the position above the peripheral portion to the position above the central portion. During this movement, the rotation of the developer nozzle 31, the discharge of the developer and the rotation of the wafer W are performed, similarly to the first embodiment. That is, the liquid puddle 30 spreads from the peripheral portion toward the central portion of the wafer W, and the turning flow is formed in the liquid puddle 30. However, note that, when the liquid puddle 30 spreads in this manner, interfaces (surfaces) of the developer spreading over the surface of the wafer W merge at the central portion of the wafer W. As described above, there is a possibility that the CDU in the plane of the wafer W might be degraded due to the merging of the developer. Thus, the liquid puddle 30 preferably spreads from the central portion toward the peripheral portion of the wafer W.

In the foregoing embodiment, the moving of the developer nozzle 31 along the radial direction of the wafer W and the rotating of the wafer W are simultaneously performed to form the liquid puddle 30 on the whole surface of the wafer W. However, the method of forming the liquid puddle 30 is not limited thereto. In one modification, the developer is supplied to form a puddle along the radial direction of the wafer W, by moving the developer nozzle 31 from the central portion toward the peripheral portion of the wafer W, as described above, while the wafer W is under a stationary state. After that, the wafer W is rotated so that the developer flows on the surface of the wafer W by the centrifugal force, whereby the whole wafer W is coated with the developer. This process can also reduce the developer consumption, prevent spattering of the developer, and promote the reaction due to the flow of the developer. However, in order to improve the CDU in the plane of the wafer W, it is effective that the rotation of the wafer W and the movement of the developer nozzle 31 are simultaneously performed.

<Second Embodiment>

Figure 18:
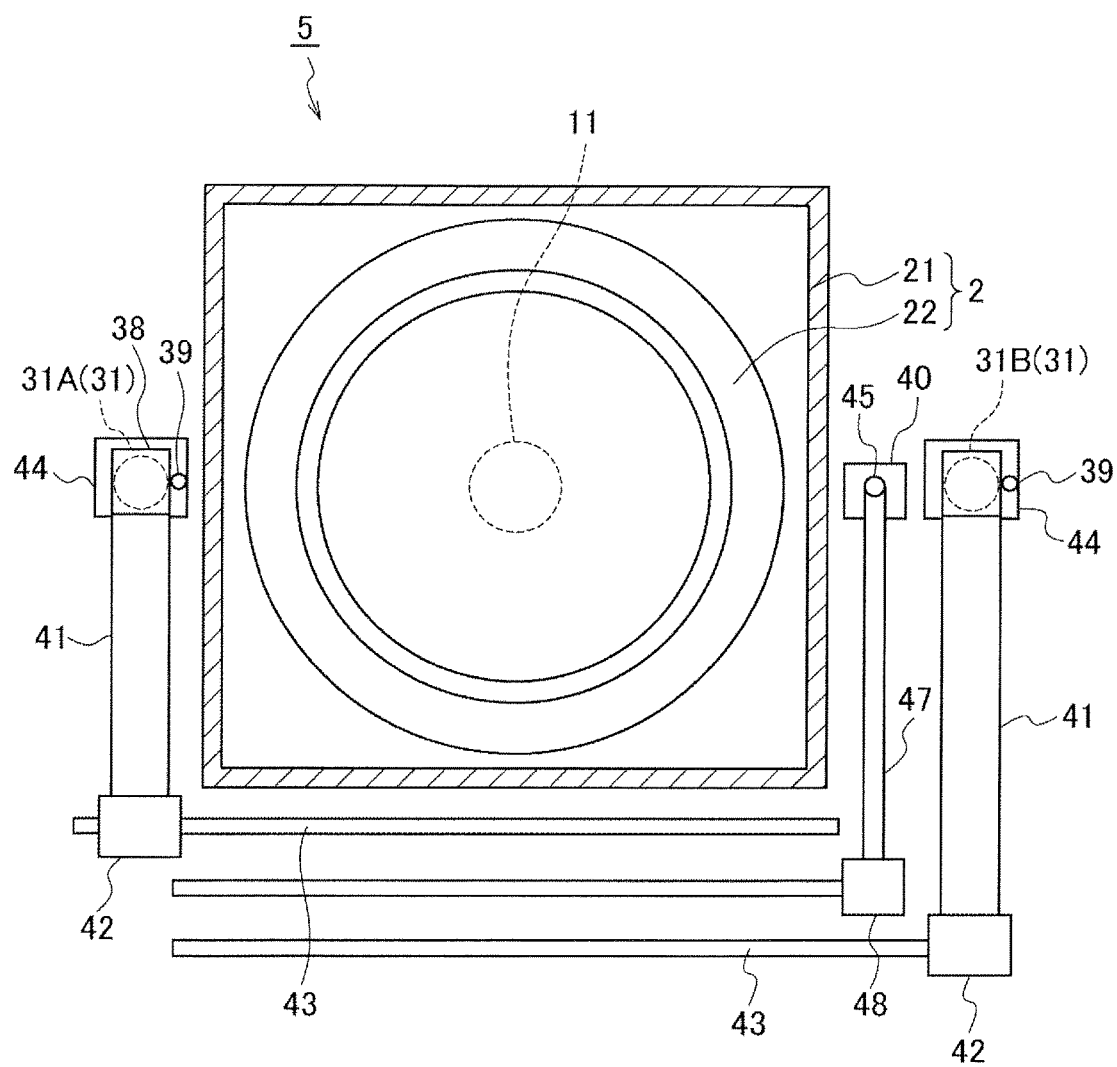
FIG. 18 is a plan view of another developing apparatus.

Next a second embodiment is described, focusing on the differences from the first embodiment. FIG. 18 is a plan view showing a developing apparatus 5 used in the second embodiment. The developing apparatus 5 differs from the developing apparatus 1 in that the two developer nozzles 31 are provided. The developer supply pipe 39, the arm 41, the moving mechanism 42, the guide rail 43 and the waiting area 44 are provided for each of the developer nozzles 31. Thus, the rotation, the discharge of the developer and the movement in the radial direction of the wafer W can be independently performed by each developer nozzle 31. For the convenience of explanation, these developer nozzles 31 are shown by the first developer nozzle 31A and the second developer nozzle 31B.

Figure 21:
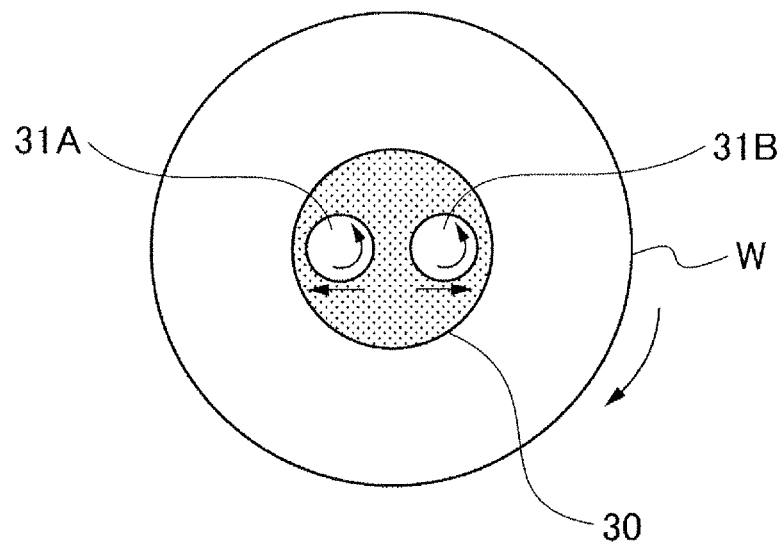
FIG. 21 illustrates yet another process step in the second embodiment.
Figure 22:
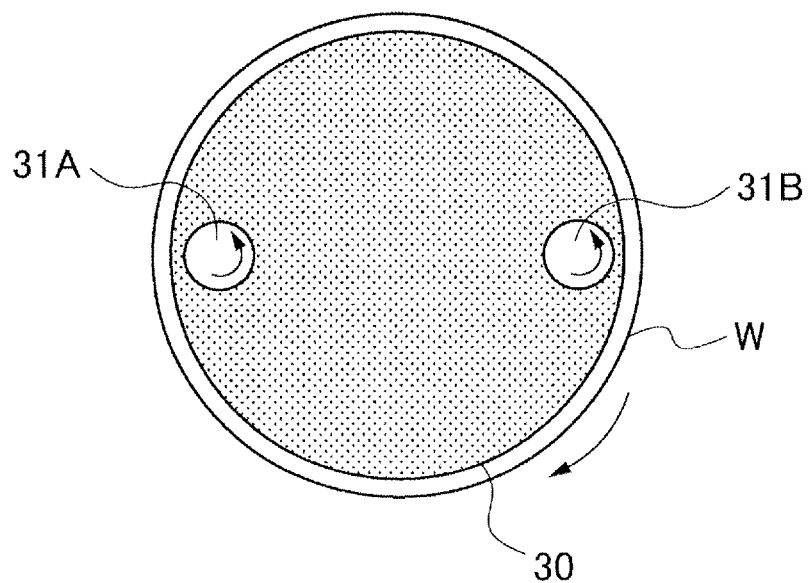
FIG. 22 illustrates yet another process step in the second embodiment.
Figure 23:
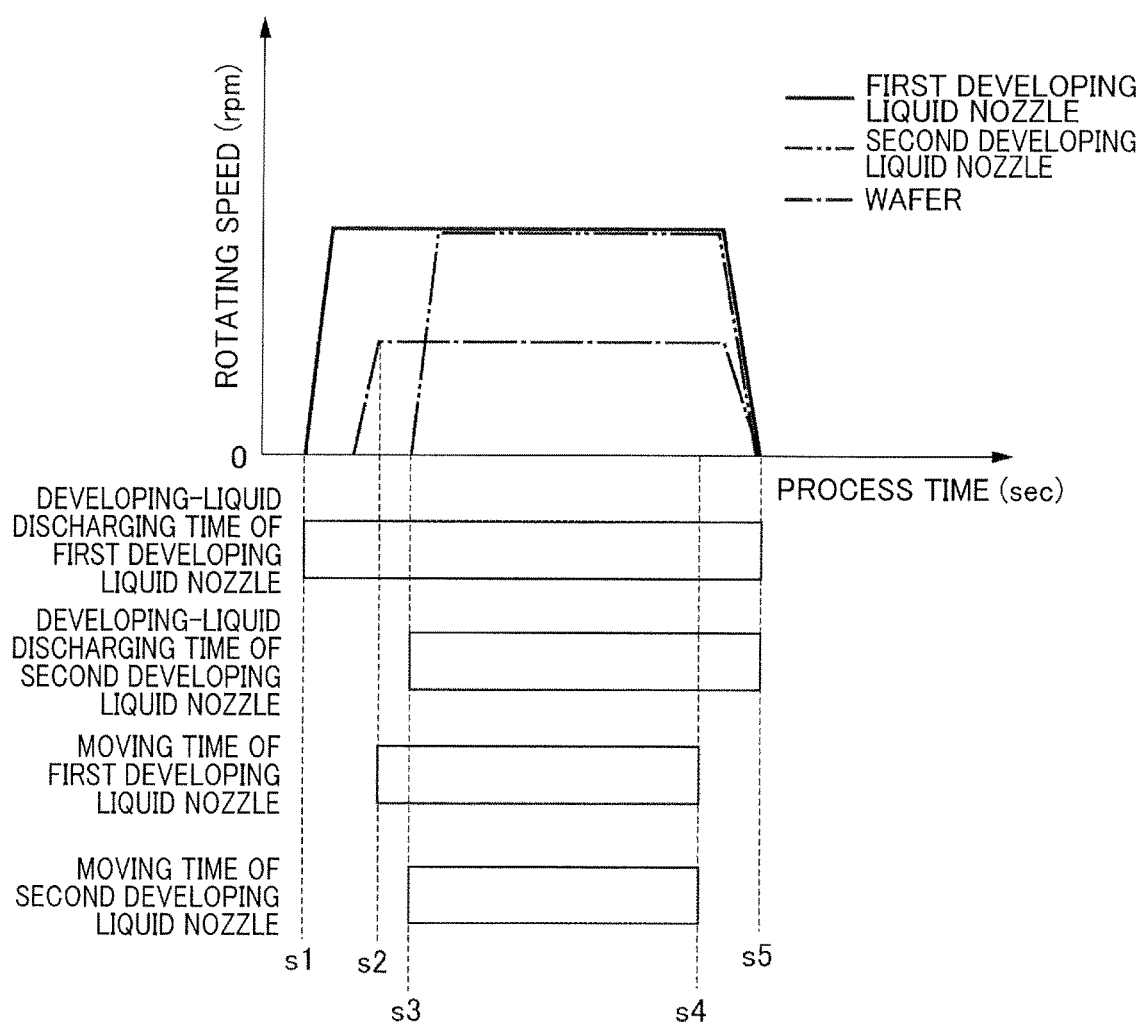
FIG. 23 is a time chart of the process steps of FIGS. 19 to 23.

A developing process in the second embodiment is explained with reference to the operational views of the developing apparatus 5 shown in FIGS. 19 to 22 and the time chart shown in FIG. 23. Similarly to FIG. 15, the time chart of FIG. 23 shows the rotating speed of the wafer W, the rotating speed of the developer nozzle, the time period at which the developer is discharged and the time period at which the developer nozzle is moved. The variation of the rotating speed of the first developer nozzle 31A is shown by the solid line, and the variation of the rotating speed of the second developer nozzle 31B is shown by the two-dot chain line.

Figure 19:
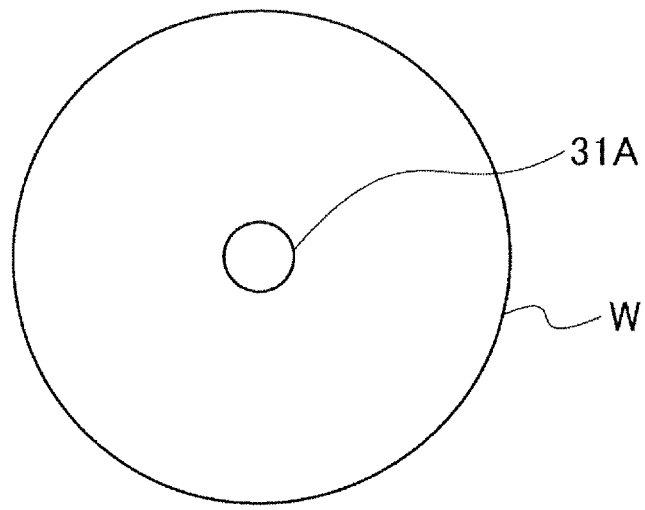
FIG. 19 illustrates a process step in a second embodiment.
Figure 20:
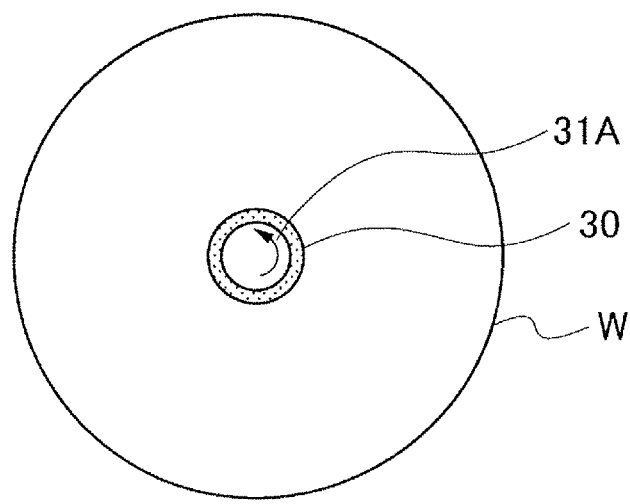
FIG. 20 illustrates another process step in the second embodiment.

Firstly, the first developer nozzle 31A is placed in a position in proximity above the central portion of the stationary wafer W, similarly to the first embodiment (FIG. 19). Although not shown in the drawings, the second developer nozzle 31B waits above a predetermined position (hereinafter referred to as "intermediate portion") on the diameter of the wafer W between the central portion and the peripheral portion of the wafer W. The first developer nozzle 31A is rotated counterclockwise in a plan view, and a developer is discharged from the first developer nozzle 31A (time point s1 in the time chart of FIG. 23). Thus, the liquid puddle 30 is formed below the first developer nozzle 31A, and a turning flow is generated in the liquid puddle 30 (FIG. 20).

When the wafer W starts rotating clockwise in a plan view and then reaches a predetermined rotating speed, the first developer nozzle 31A moves toward a position above the peripheral portion of the wafer W (time point s2), so that the liquid puddle 30 is spread out to the peripheral portion of the wafer W. Thereafter, the second developer nozzle 31B is lowered to come close to the intermediate portion of the wafer W, so as to be located above the liquid puddle 30 formed by the first developer nozzle 31A. The second developer nozzle 31B is rotated counterclockwise in a plan view, and the developer is discharged from the second developer nozzle 31B (FIG. 21, time point s3). Thus, a turning flow is also generated in the liquid puddle 30 below the second developer nozzle 31B. The second developer nozzle 31B rotates and discharges the developer, and at the same time, the second developer nozzle 31B is moved toward the peripheral portion of the wafer W along the radius of the wafer W in the direction opposed to the moving direction of the first developer nozzle 31A.

The first and second developer nozzles 31A and 31B are continuously moved toward the peripheral portion of the wafer W. When they reach positions above the peripheral portion so that the liquid puddle 30 is formed on the whole surface of the wafer W, the movement of the developer nozzles 31A and 31B is stopped (FIG. 22, time point s4). Thereafter, the rotating speeds of the developer nozzles 31A and 31b decrease to stop the rotation thereof, and the discharging of the developer from the developer nozzles 31A and 31B is stopped (time point s5). In this manner, until the discharge of the developer is stopped, the first developer nozzle 31A passes through the whole surface of the wafer W, similarly to the developer nozzle 31 of the first embodiment. After the discharge of the developer from the respective developer nozzles 31A and 31B is stopped, the reaction of the resist proceeds by the liquid puddle 30 of the developer, similarly to the first embodiment. After a predetermined period of time has elapsed from the time point s5, the wafer W is rotated and a cleaning liquid is supplied thereto, so that the developer is removed from the wafer W.

In the second embodiment, as described above, the developer on the central portion of the wafer W is stirred by the developer nozzle 31A, and the developer between the intermediate portion and the peripheral portion of the wafer W is stirred by the developer nozzles 31A and 31B. Namely, the second developer nozzle 31B is disposed for assisting the operation for stirring the liquid puddle 30 by the first developer nozzle 31A. Due to this process performed in this manner, the stirring of the developer is promoted in an area from the intermediate portion to the peripheral portion, so as to improve the developer concentration uniformity. Thus, the CD uniformity of the resist pattern in the plane of the wafer W can be more reliably improved. In particular, if the size of the wafer W is large, the amount of the dissolved product flowing together with the flow in the liquid puddle 30 toward the peripheral portion of the wafer W (described in the description of the first embodiment) may increase, so that it may make it difficult to achieve high developer concentration uniformity. Thus, the stirring of the developer by using the respective developer nozzles 31A and 31B is advantageous.

Figure 24:
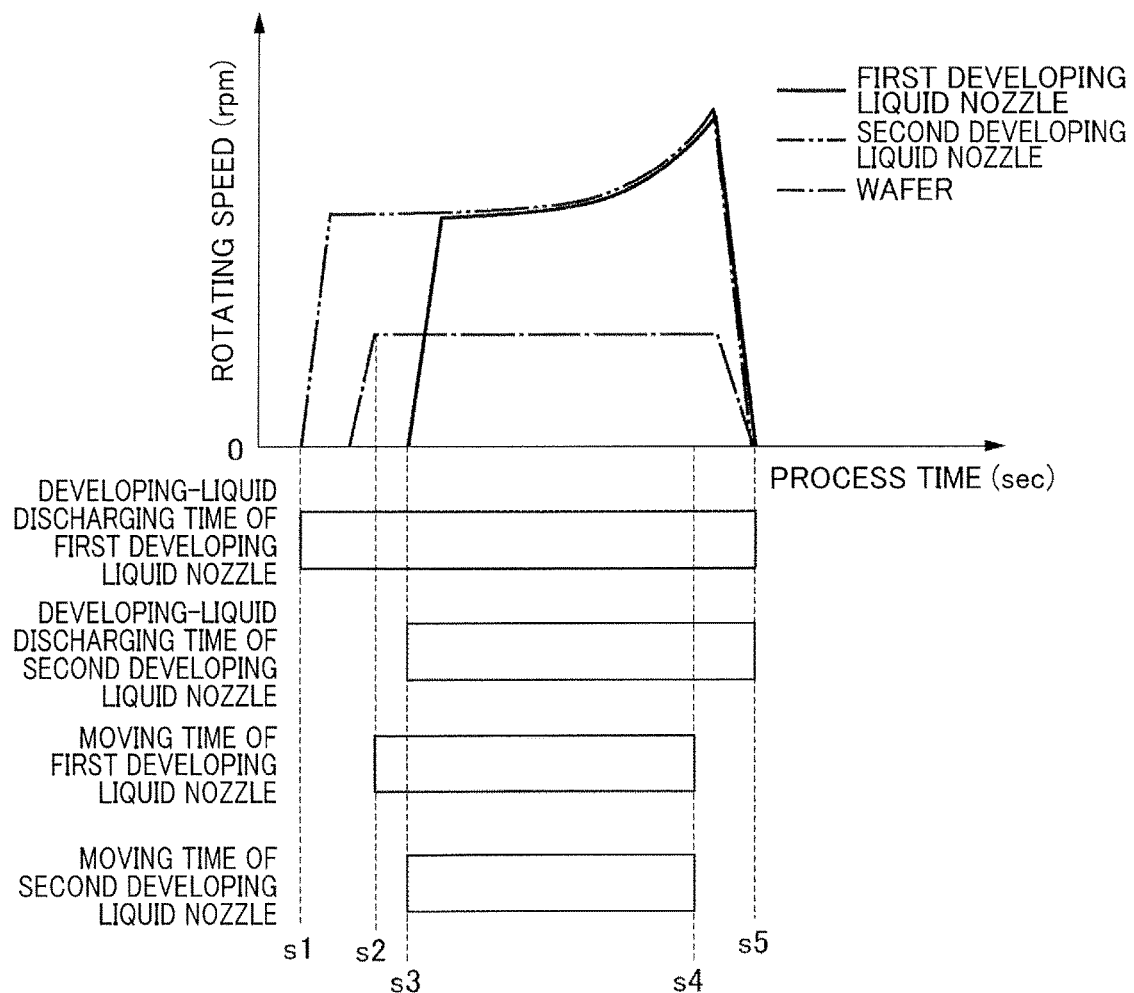
FIG. 24 is a time chart for a modification of the process steps.

FIG. 24 shows a time chart in one modification of the second embodiment. The time chart of FIG. 24 differs from the time chart of FIG. 23 in that the rotating speed of the developer nozzle 31 is increased as the developer nozzle 31 moves toward the peripheral portion of the wafer W, similarly to the modification of the first embodiment. In this example, although the rotating speeds of the first and second developer nozzles 31A and 31B are both increased, only one of them may be increased.

In the foregoing embodiment, although the first developer nozzle 31A and the second developer nozzle 31B are rotated in the same direction, they may be rotated in opposite directions. The rotating speeds of the developer nozzles 31A and 31B are 50 rpm to 1000 rpm, for example. The rotating speeds may be identical to each other or different from each other. The bottom surface 35 of the of the second developer nozzle 31B and the bottom surface 35 of the first developer nozzle 31A may be identical to each other in size or different from each other in size. In a case where the sizes of the bottom surfaces 35 are different from each other, the size of the bottom surface 35 of the second developer nozzle 31B may be smaller than that of the bottom surface 35 of the first developer nozzle 31A, for the purpose of assisting the stirring operation of the first developer nozzle 31A. In another embodiment, the second developer nozzle 31B may be operated such that it does not discharge the developer but just rotates to stir the developer. In yet another embodiment, the first developer nozzle 31A and the second developer nozzle 31B may be operated such that, after the first developer nozzle 31A forms the liquid puddle 30 at the central portion of the wafer W, supply of the developer from the first developer nozzle 31A is stopped and the supply of the developer from the second developer nozzle 31B is started to spread out the liquid puddle 30 to the peripheral portion of the wafer W. In this case, both of the developer nozzles 31A and 31B may be rotated and move to the peripheral portion of the wafer W in the same manner as in the second embodiment.

<Third Embodiment>

Figure 29:
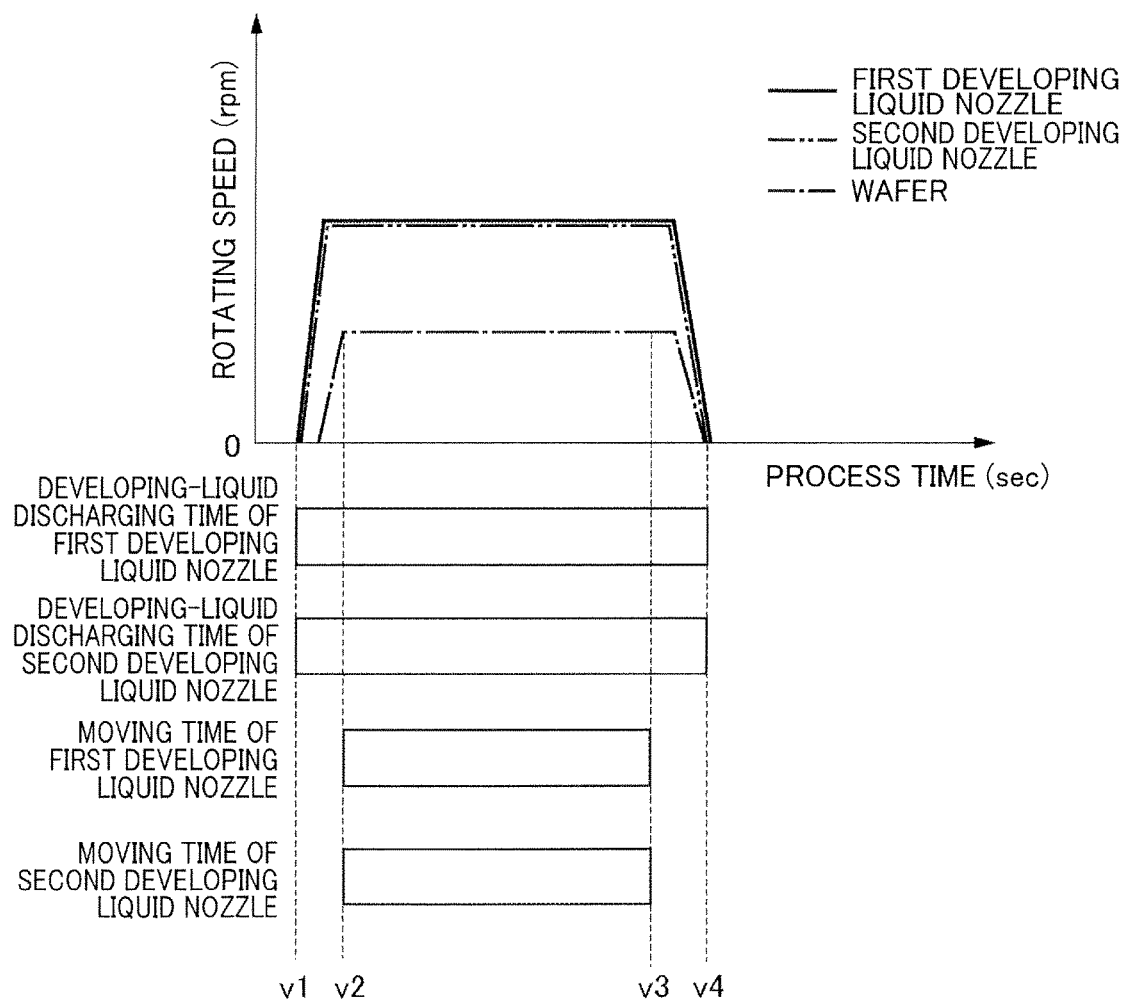
FIG. 29 is a time chart of the process steps of FIGS. 25 to 28.

Next, a third embodiment is described. In the third embodiment, the developing apparatus 5 explained in the second embodiment is used. A developing process in the third embodiment is explained with reference to the operation diagrams of the developing apparatus 5 shown in FIGS. 25 to 28. Similarly to the second embodiment, a time chart of FIG. 29 shows the rotating speed of the wafer W in the developing process in the third embodiment, the rotating speeds of the respective developer nozzles, the discharge time periods of the developer and the moving time periods of the respective developer nozzles.

Figure 25:
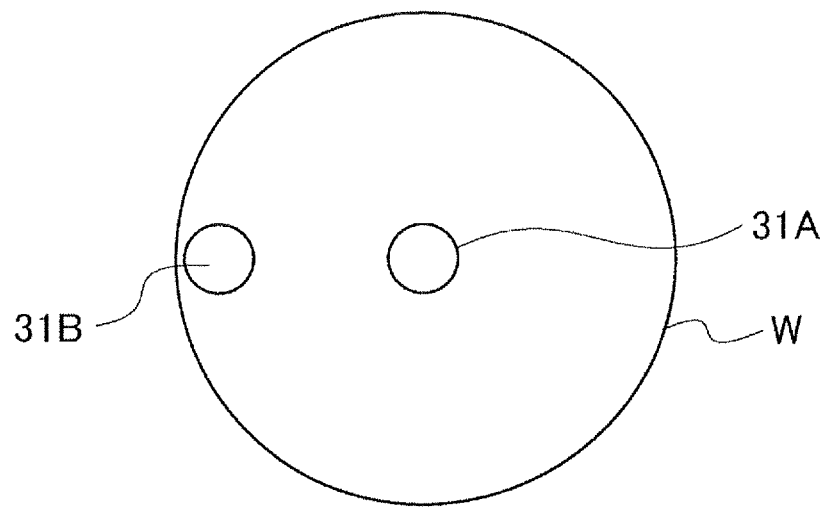
FIG. 25 illustrates a process step in a third embodiment.
Figure 26:
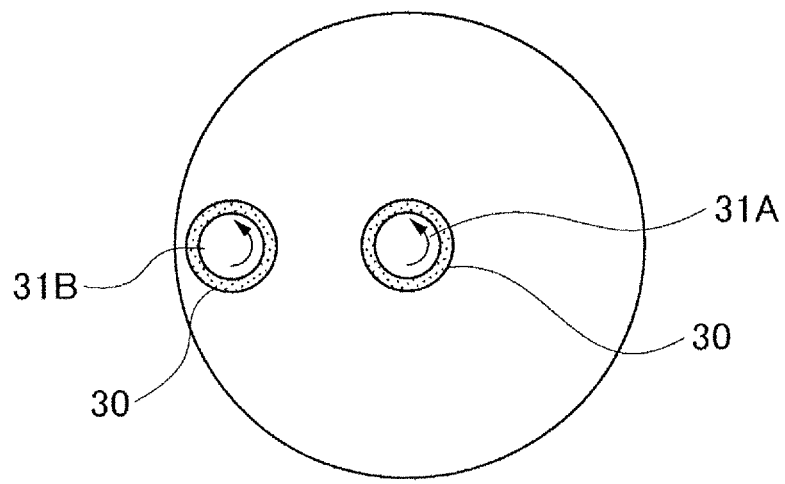
FIG. 26 illustrates another process in the third embodiment.

The first developer nozzle 31A is located above the central portion of the wafer W, and the second developer nozzle 31B is located above the peripheral portion of the wafer W, respectively, and they are lowered to come close to the wafer W (FIG. 25). The developer is discharged respectively from the first developer nozzle 31A and the second developer nozzle 31B, and the developer nozzles 31A and 31B are rotated counterclockwise in a plan view. Thus, the liquid puddles 30 are formed below the respective developer nozzles 31A and 31B, and a turning flow is formed in each liquid puddle 30 (FIG. 26, time point v1 in chart of FIG. 29). When the wafer W starts rotating clockwise in a plan view and reaches a predetermined rotating speed, the first developer nozzle 31A is moved toward the peripheral portion side of the wafer W and the second developer nozzle 31B is moved toward the central portion side of the wafer W, in the same direction (time point v2).

Figure 27:
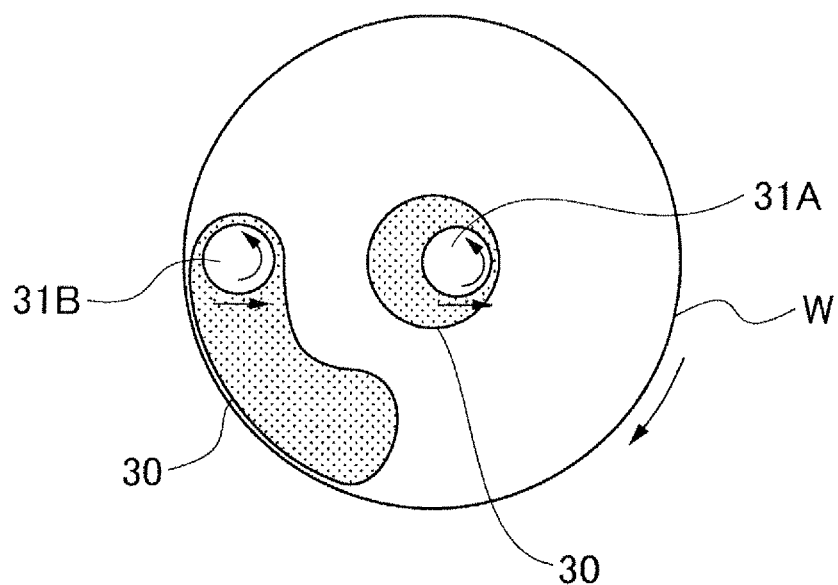
FIG. 27 illustrates yet another process step in the third embodiment.
Figure 28:
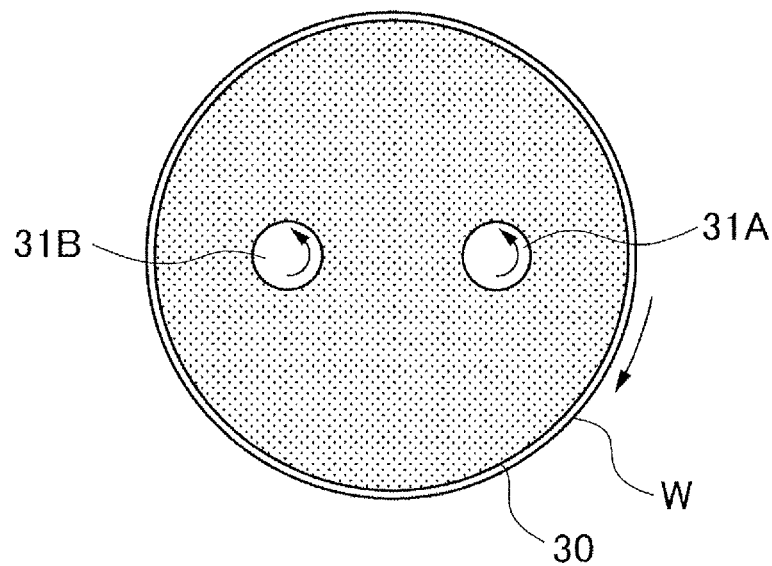
FIG. 28 illustrates yet another process step in the third embodiment.

The liquid puddles 30, which have been formed by the first developer nozzle 31A and the second developer nozzle 31B, are spread out on the surface of the wafer W by the movement of the respective developer nozzles 31A and 31B (FIG. 27). Their interfaces (i.e., surfaces) merge with each other, so that the whole wafer W is coated with the liquid puddle 30. During this operation, similarly to the other embodiments, the developer is stirred by the turning flows below the developer nozzles 31A and 31B. When the first developer nozzle 31A and the second developer nozzle 31B are positioned above the intermediate portions of the wafer W, the movement of these developer nozzles 31A and 31B is stopped (time point v3, FIG. 28). After that, the rotation of the developer nozzles 31A and 31B is stopped, and the discharge of the developer from the respective developer nozzles 31A and 31B is stopped (time point v4). During the period from when the rotation of the developer nozzles 31A and 31B is started to when the rotation thereof is stopped, the whole surface of the wafer W passes through at least one of an area right below the first developer nozzle 31A and an area right below the second developer nozzle 31B. Thus, the developer is stirred over the whole surface of the wafer W.

According to the third embodiment, the first developer nozzle 31A and the second developer nozzle 31B form the liquid puddles 30 simultaneously in the different areas within the plane of the wafer W. Then, the first and second developer nozzles 31A and 31B spread the liquid puddles 30 and generate turning flows in the respective liquid puddles 30. Thus, the liquid puddle 30 can be formed rapidly over the entire surface of the wafer W, and the developer can be stirred over the entire surface of the wafer W. As a result, the time required for the developing process can be further reduced. However, if the interfaces of the developer puddles merge with each other on the wafer W as described above, there is a possibility that the CDU might be degraded. Thus, in view of the improvement of the CDU, it is preferable to perform the developing process according to the first and second embodiments.

Figure 30:
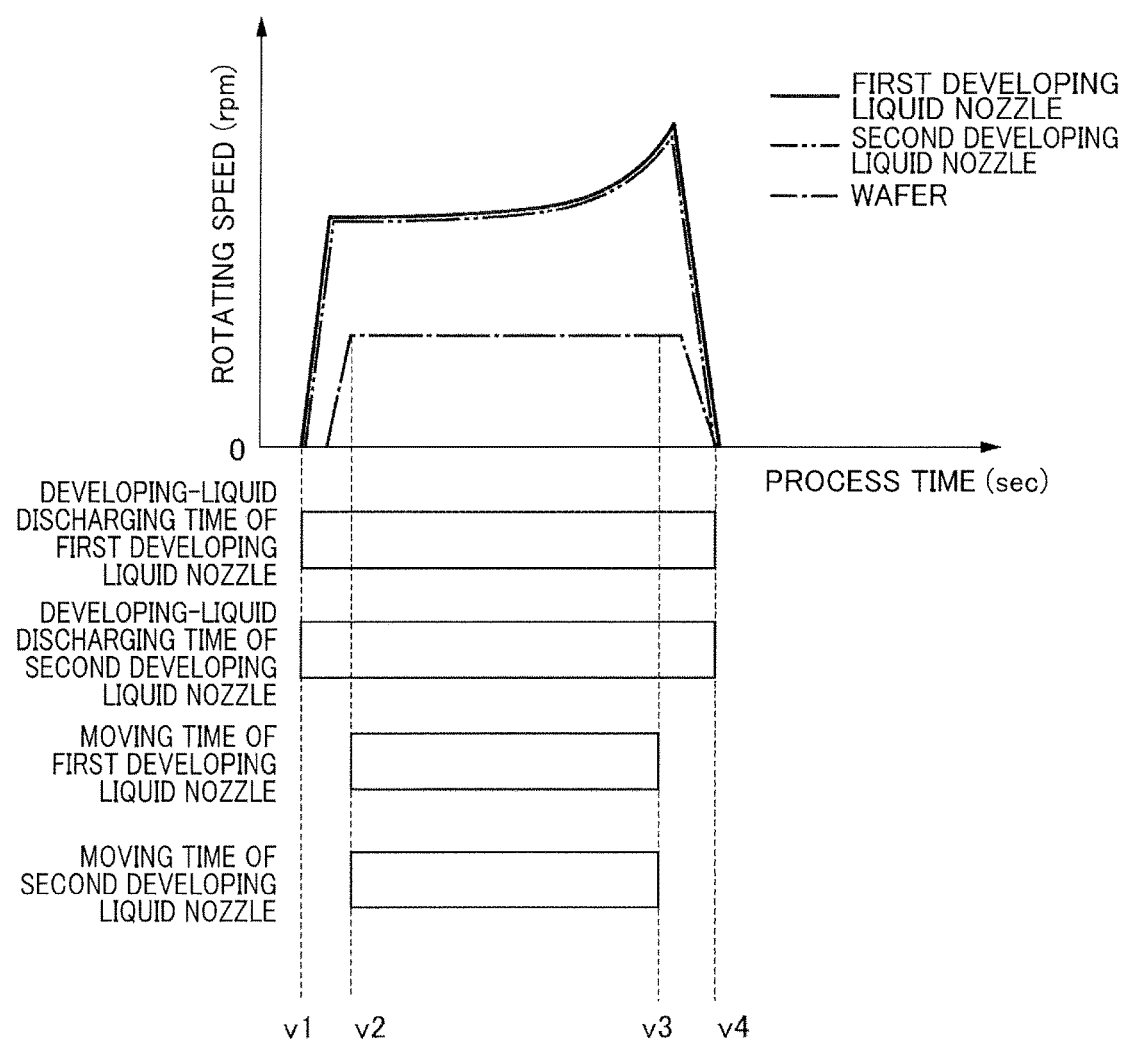
FIG. 30 is a time chart for a modification of the process steps.

FIG. 30 shows a time chart in one modification of the third embodiment. The time chart of FIG. 30 differs from the time chart of FIG. 29 in that the rotating speed of the first developer nozzle 31A is increased as the first developer nozzle 31A is moved from a position above the central portion of the wafer W to a position above the intermediate portion of the wafer W, and that the rotating speed of the second developer nozzle 31B is increased as the second developer nozzle 31B is moved from a position above the peripheral portion of the wafer W to a position above the intermediate portion of the wafer W. In the third embodiment, since the liquid paddle 30 spreads toward the intermediate portion, the contact time between the developer and the resist becomes shorter according to the proximity to the intermediate portion. Thus, as shown in the time chart of FIG. 30, the rotating speeds of the developer nozzles 31A and 31B are controlled so as to improve the CDU within the plane of the wafer W. Also in this third embodiment, the rotating directions and the rotating speeds of the developer nozzles 31A and 31B may be identical with each other or different from each other. The size of the bottom surfaces 35 of the respective developer nozzles 31A and 31B may be different from each other.

<Fourth Embodiment>

Figure 35:
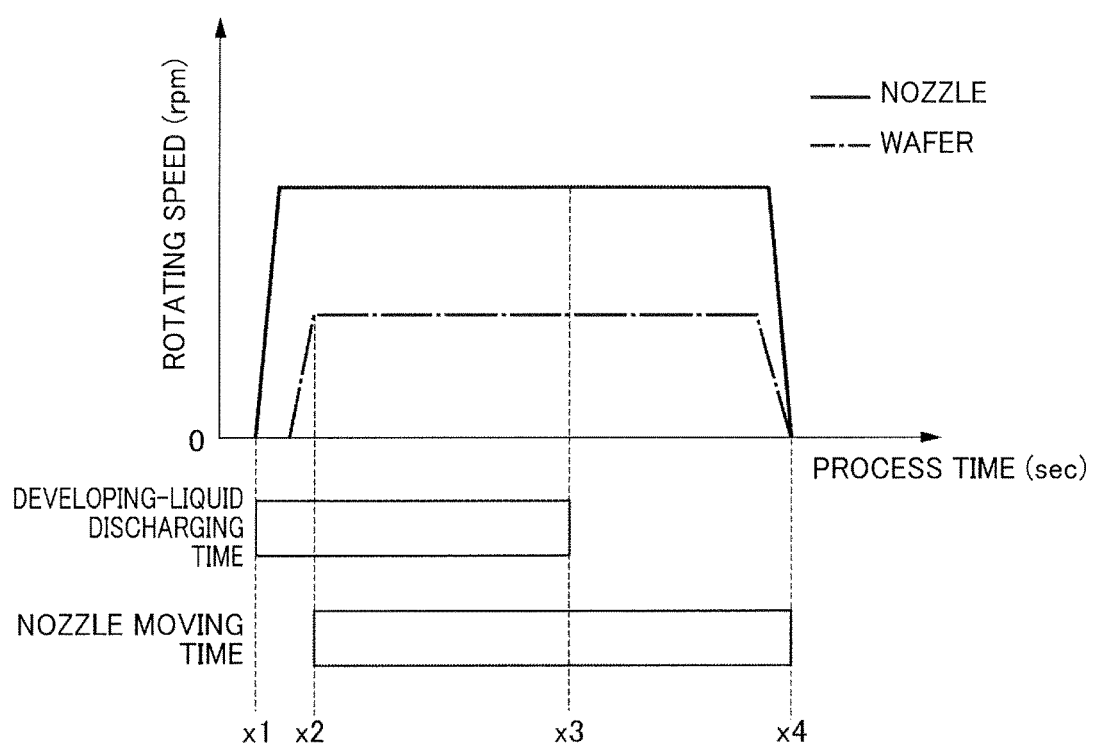
FIG. 35 a time chart of the process steps of FIGS. 31 to 34.

Next, a fourth embodiment is described. In the fourth embodiment, the developing apparatus 1 explained in the first embodiment is used. A developing process of the fourth embodiment is explained with reference to the step chart shown in FIGS. 31 to 34, focusing on the differences from the first embodiment. A time chart for the fourth embodiment shown in FIG. 35 is also referred to as needed basis.

Figure 31:
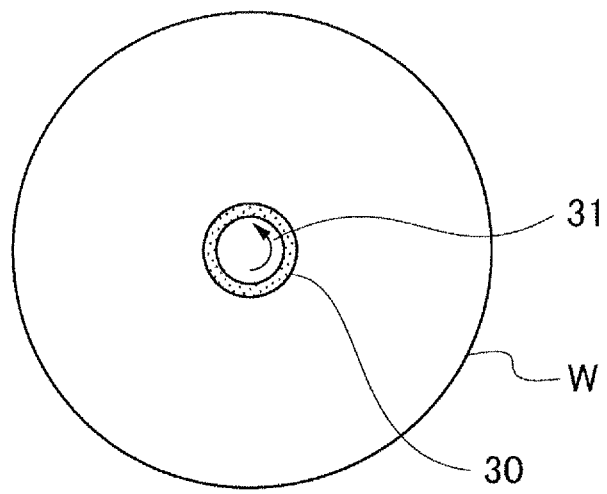
FIG. 31 illustrates a process step in a fourth embodiment.
Figure 32:
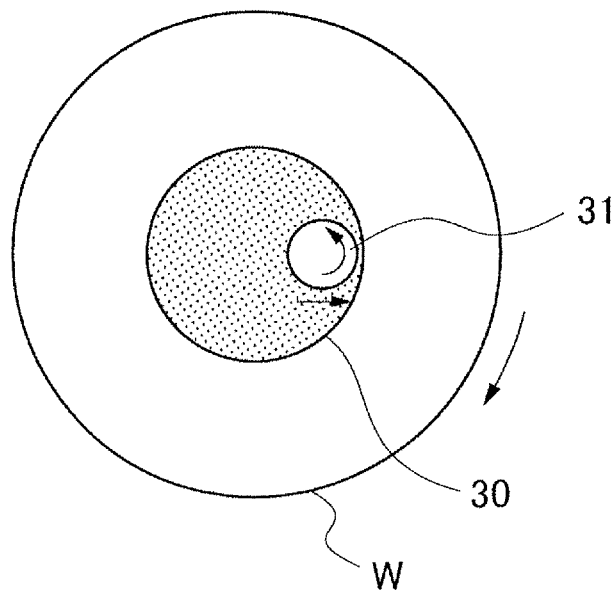
FIG. 32 illustrates another process step in the fourth embodiment.
Figure 33:
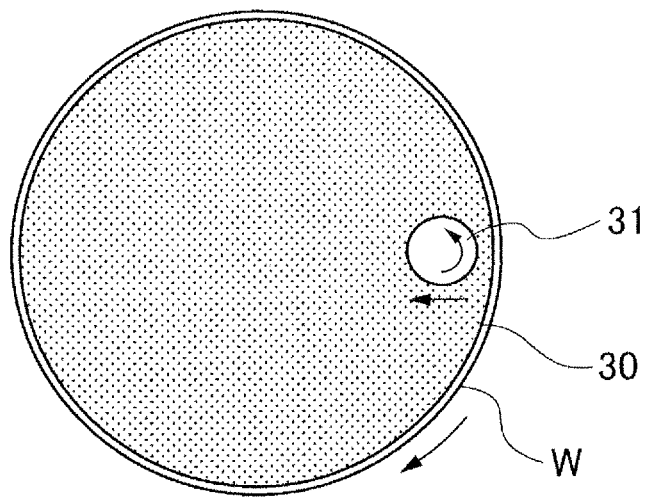
FIG. 33 illustrates yet another process step the fourth embodiment.
Figure 34:
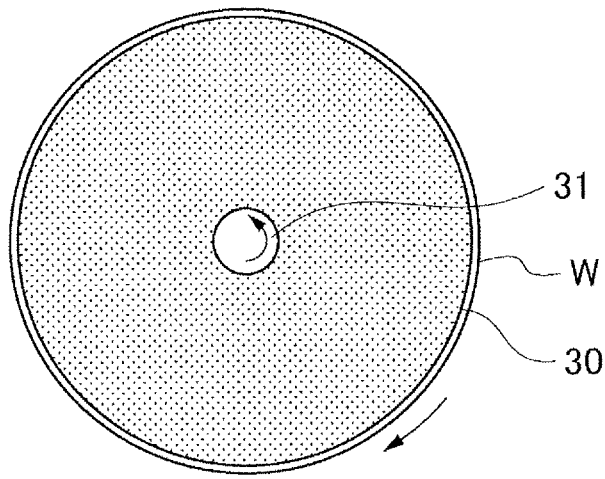
FIG. 34 illustrates yet another process step in the fourth embodiment.

Similarly to the first embodiment, the developer nozzle 31 is positioned in proximity above the central portion of the wafer W, and a developer is discharged so that the liquid puddle 31 is formed. In addition, a turning flow is formed in the liquid puddle 30 by the rotation of the developer nozzle 31 (FIG. 31, time point x1 in chart of FIG. 35). The wafer W is rotated and the developer nozzle 31 is moved toward a position above the peripheral portion of the wafer W (time point x2), so that the liquid puddle 30 spreads toward the peripheral portion of the wafer W (FIG. 32). When the developer nozzle 31 is positioned above the peripheral portion of the wafer W so that the liquid puddle 30 spreads over the whole surface of the wafer W, the discharge of the developer from the developer nozzle 31 is stopped (time point x3), and the developer nozzle 31, which is continuously rotated, is moved toward the position above the central portion of the wafer W (FIG. 33). Thus, the turning flow is continuously formed in the liquid puddle 30. When the developer nozzle 31 is positioned above the central portion of the wafer W (FIG. 34), the rotation of the developer nozzle 31 and the rotation of the wafer W are stopped (time point x4). Almost simultaneously with the stop of the rotation of the wafer W, a cleaning liquid is supplied from the cleaning liquid nozzle 45 to clean the wafer W.

As described above, since the developer nozzle 31 is reciprocated between the position above the central portion of the wafer W and the position above the peripheral portion of the wafer W, each portion of the whole surface of the wafer W passes twice through an area right below the developer nozzle 31 and thus the developer on each portion is stirred. Thus, according to the fourth embodiment, the reaction between the developer and the resist can be further promoted than the first embodiment. As a result, the time period from when the rotation of the developer nozzle 31 is stopped to when the cleaning liquid is discharged by the cleaning liquid nozzle 45 can be set shorter than the first embodiment. According to the fourth embodiment, the throughput can be further improved than that of the first embodiment.

Figure 36:
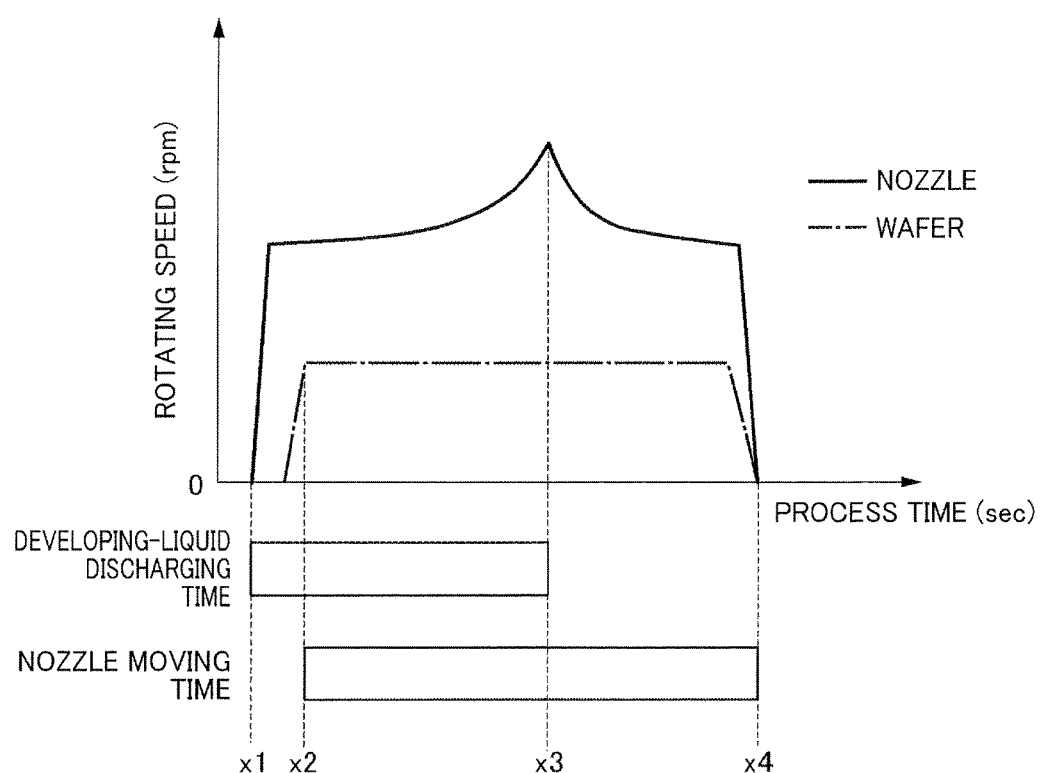
FIG. 36 is a time chart for a modification of the process steps.

FIG. 36 shows a time chart of a modification of the fourth embodiment. The time chart of FIG. 36 differs from the time chart of FIG. 35 in that the rotating speed of the developer nozzle 31 is increased as the developer nozzle 31 is moved from a position above the central portion of the wafer W to a position above the peripheral portion of the wafer W, and that the rotating speed of the developer nozzle 31 is decreased as the developer nozzle 31 is moved from a position above the peripheral portion to a position above the central portion. This operation promotes the reaction between the developer and the resist on the peripheral portion, in view of the fact that the contact time between the developer and the resist shortens as approaching the peripheral portion of the wafer W, as explained in connection with the first embodiment.

In the fourth embodiment, after the developer nozzle 31 has been located above the peripheral portion of the wafer W, the discharge of the developer is stopped in order to reduce the developer consumption. However, the developer may be discharged even when the developer nozzle is being moved to the position above the central portion. In addition, the number of movements of the rotating developer nozzle 31 between the position above the central portion of the wafer W and the position above the peripheral portion of the wafer W is not limited to the number in the forgoing, but may be more. Namely, in the foregoing, after the developer nozzle 31 is returned to the position above the central portion of the wafer W, the developer nozzle 31 may be again moved to the position above the peripheral portion of the wafer W.

Alternatively, the developer nozzle 31 may be reciprocated above the wafer W such that, after the discharge of the developer is started on a position above the peripheral portion of the wafer W, the developer nozzle 31 is moved to a position above the central portion of the wafer W, and that the developer nozzle 31 is returned to the position above the peripheral portion of the wafer W. However, as described in connection with the first embodiment, in order to improve the CDU, it is preferable that the discharge of the developer is started at a position above the central portion of the wafer W.

<Fifth Embodiment>

Figure 37:
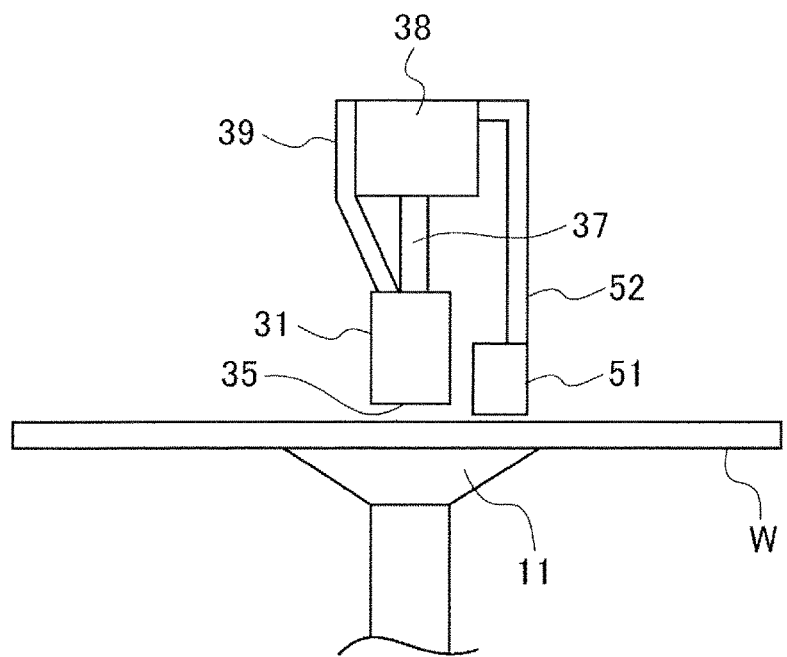
FIG. 37 is a side elevational view of a developer nozzle in another developing apparatus.
Figure 38:
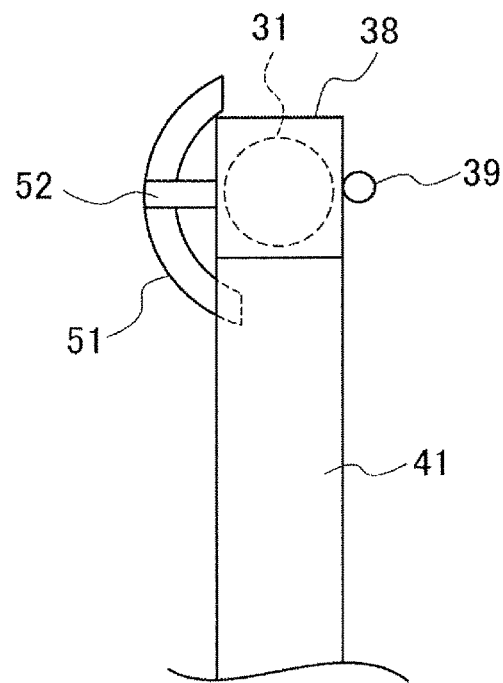
FIG. 38 is a plan view of the nozzle of the another developing apparatus.

Next, a fifth embodiment is explained. A developing apparatus used in the firth embodiment has substantially the same structure as that of the developing apparatus 1 used in the first embodiment, except that the developing apparatus in the fifth embodiment is provided with a restricting member 51 for restricting spreading of the developer on the wafer W. FIGS. 37 and 38 show the restricting member 51. The restricting member 51 is disposed apart from the developer nozzle 31 in a traveling direction of the developer nozzle 31 in which the developer nozzle 31 is moved for spreading the liquid puddle 30. During the movement of the developer nozzle 31, even when the developer forming the liquid puddle 30 flows in the traveling direction under the influence of the moving developer nozzle 31, the restricting member 51, which is located in the traveling direction, restricts the flow of the developer.

The restricting member 51 has an arcuate shape in plan view, in this example. A surface of the restricting member 51 is formed of a material such as PFA (tetrafluoroethylene perfluoroalkylvinylether copolymer) or PTFE (polytetrafluoroethylene). The reference number 52 depicts a support part, via which the restricting member 51 is supported on the rotating mechanism 38. Thus, the restricting member 51 is moved together with the developer nozzle 31 by the movement of the arm 41.

The restricting member 51 is located to be slightly apart from above the surface of the wafer W, when the liquid puddle 30 is formed by the developer nozzle 31. Thus, even when the liquid puddle 30 is spread out over the surface of the wafer W to flow to a position below the restricting member 51, the liquid puddle 30 in contact with the restricting member 51 is pulled by the restricting member 51 by the surface tension, so that the liquid puddle 30 cannot flow outside the restricting member 51.

Figure 39:
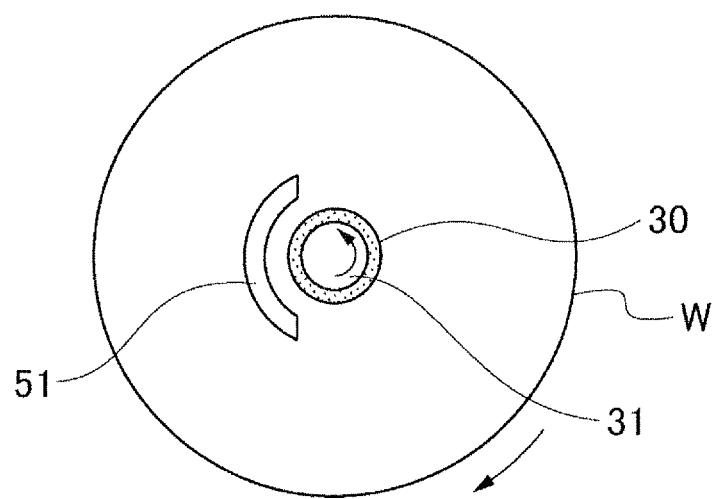
FIG. 39 illustrates a process step in a fifth embodiment.
Figure 40:
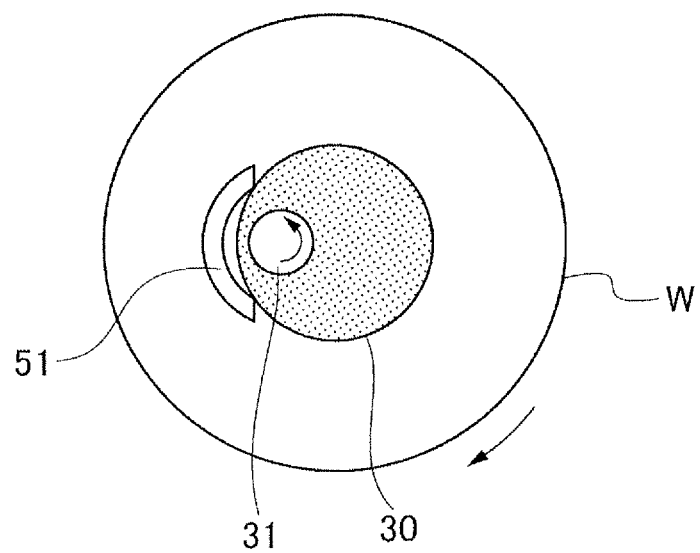
FIG. 40 illustrates another process step in the fifth embodiment.
Figure 41:
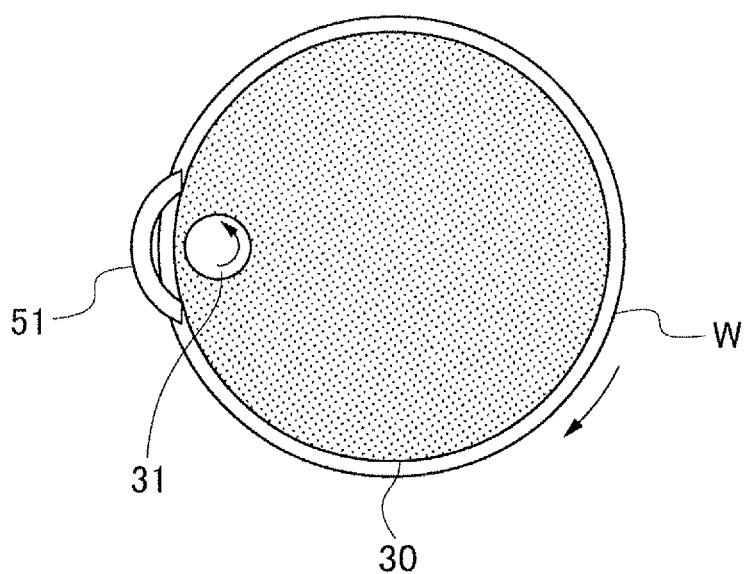
FIG. 41 illustrates yet another process step in the fifth embodiment.

A developing method of the fifth embodiment is explained with reference to the operational views of the developing apparatus shown in FIGS. 39 to 41. In the fifth embodiment, as described in the time chart of FIG. 15 for the first embodiment, for example, the operations of the respective component parts of the developing apparatus are controlled. Namely, similarly to the first embodiment, the developer nozzle 31 is placed in a position in proximity above the central portion of the wafer W, the developer is discharged to form the liquid puddle 30, and the developer nozzle 31 is rotated. Thus, a turning flow is formed in the liquid puddle 30 (FIG. 39).

Excessive spreading of the liquid puddle 30 in the plane of the wafer W in the traveling direction of the developer nozzle 31 is inhibited by means of the restricting member 51. Under this state, the liquid puddle 30 is spread out toward the peripheral portion of the wafer W by the movement of the developer nozzle 31 (FIG. 40). When the developer nozzle 31 is moved to the position above the peripheral portion of the wafer W so that the liquid puddle 30 is spread over the whole surface of the wafer W, the rotation of the developer nozzle 31 and the rotation of the wafer W are stopped (FIG. 41).

Due to the provision of the restricting member 51, the developer forming the liquid puddle 30 can be prevented from falling down to the outside of the wafer W. Thus, the developer consumption is further reduced. In the fifth embodiment, similarly to the modification of the first embodiment shown in FIG. 17, the rotating speed of the developer nozzle 31 may be increased as the developer nozzle 31 is moved toward the peripheral portion of the wafer W. The shape of the restricting member 51 is not limited to the arcuate shape, as long as the restricting member 51 can restrict the flow of the developer to the outside of the wafer W. For example, the restricting member 51 may be formed in a linear shape in a plan view.

In addition, the restricting member 51 may be operated such that it does not move together with the developer nozzle 31. For example, the restricting member 51 is connected to a moving mechanism that is separated from the moving mechanism 42 of the developer nozzle 31. The apparatus may be constituted such that, when the wafer W is processed, the restricting member 51 is moved from the outside of the wafer W to a position above the peripheral portion of the wafer W, and is held stationary in the position above the peripheral portion.

<Sixth Embodiment>

Figure 42:
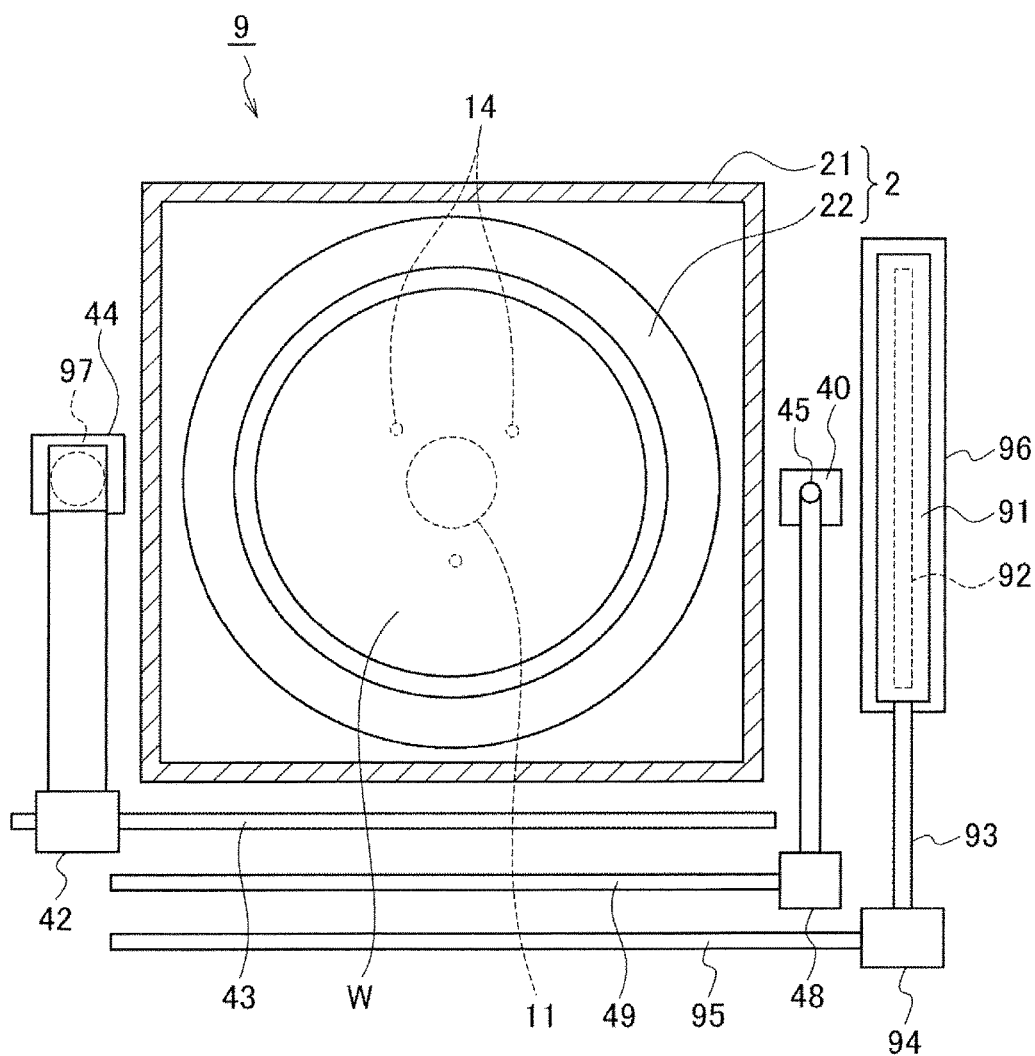
FIG. 42 is a side elevational view of a developer nozzle in yet another developing apparatus.

Next, a sixth embodiment is described. In the sixth embodiment, a liquid puddle of a developer is firstly formed over the surface of the wafer W with the stationary development method described in the Background Art section. Then, the developer in the liquid puddle 30 is stirred with the method substantially identical to the method of the first embodiment. The developing apparatus 9 used in the sixth embodiment will be described with reference to the plan view of FIG. 42, focusing on the difference from the developing apparatus 1. The developing apparatus 9 has a developer nozzle 91. The developer nozzle 91 is formed in an elongate shape and has a discharge port 92 which longer than the diameter of the wafer W. In the drawing, reference numeral 93 depicts an arm for supporting the developer nozzle 91. Reference numeral 94 depicts a moving mechanism connected to the arm 93 and moving horizontally along a guide rail 95. Reference numeral 96 depicts a stand-by region of the developer nozzle 91.

In the developing apparatus 9, a rotary member 97 is provided instead of the developer nozzle 31. The rotary member 97 has the same structure as that of the developer nozzle 31, except that the discharge port 36 is not formed in the lower surface 35 and the developer supply pipe 39 is not connected. That is, unlike the developer nozzle 31, the rotary member 97 does not discharge the developer; but like the developer nozzle 31, the rotary member 97 stirs the developer.

Figure 43:
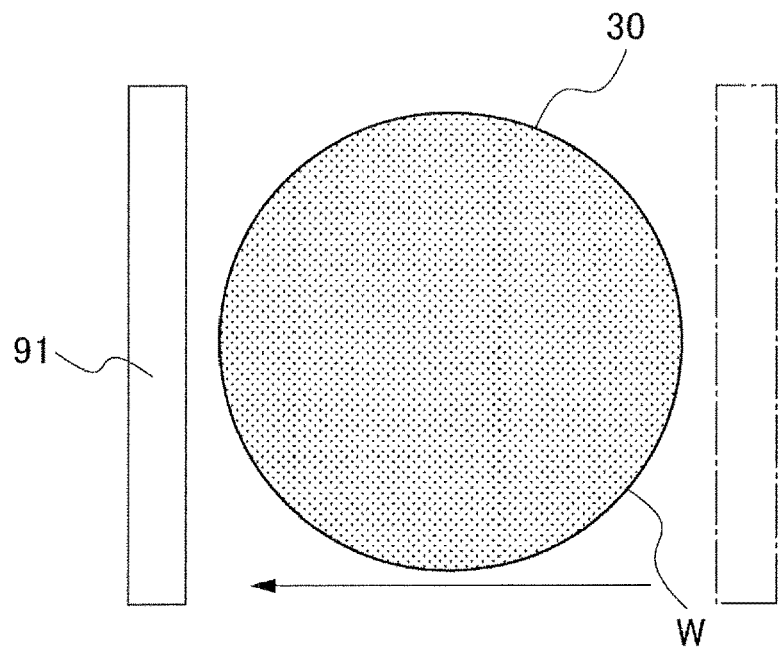
FIG. 43 illustrates a process step in a sixth embodiment.
Figure 44:
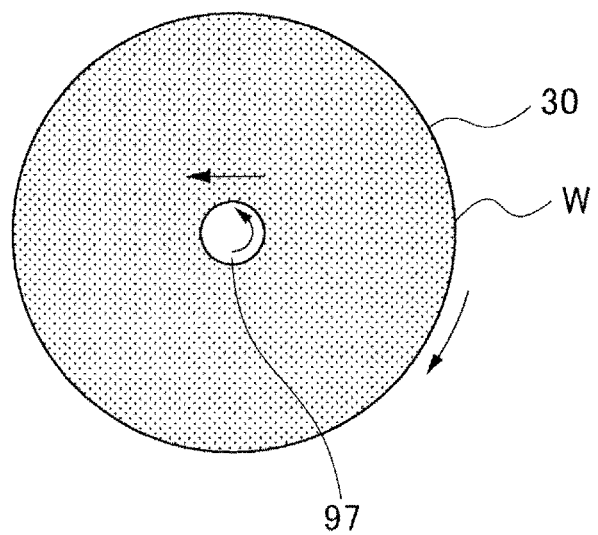
FIG. 44 illustrates another process step in the sixth embodiment.
Figure 45:
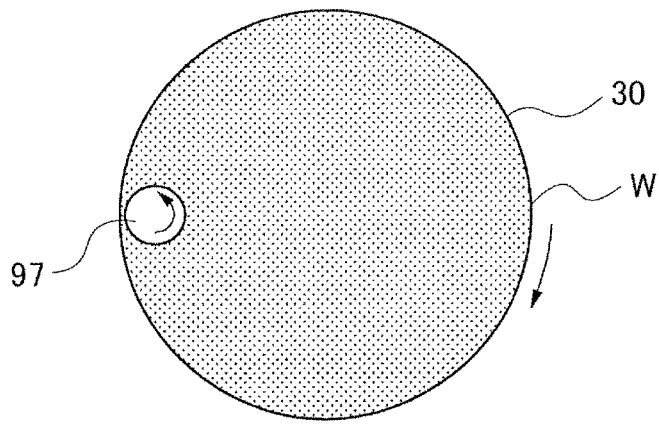
FIG. 45 illustrates yet another process in the sixth embodiment.
Figure 46:
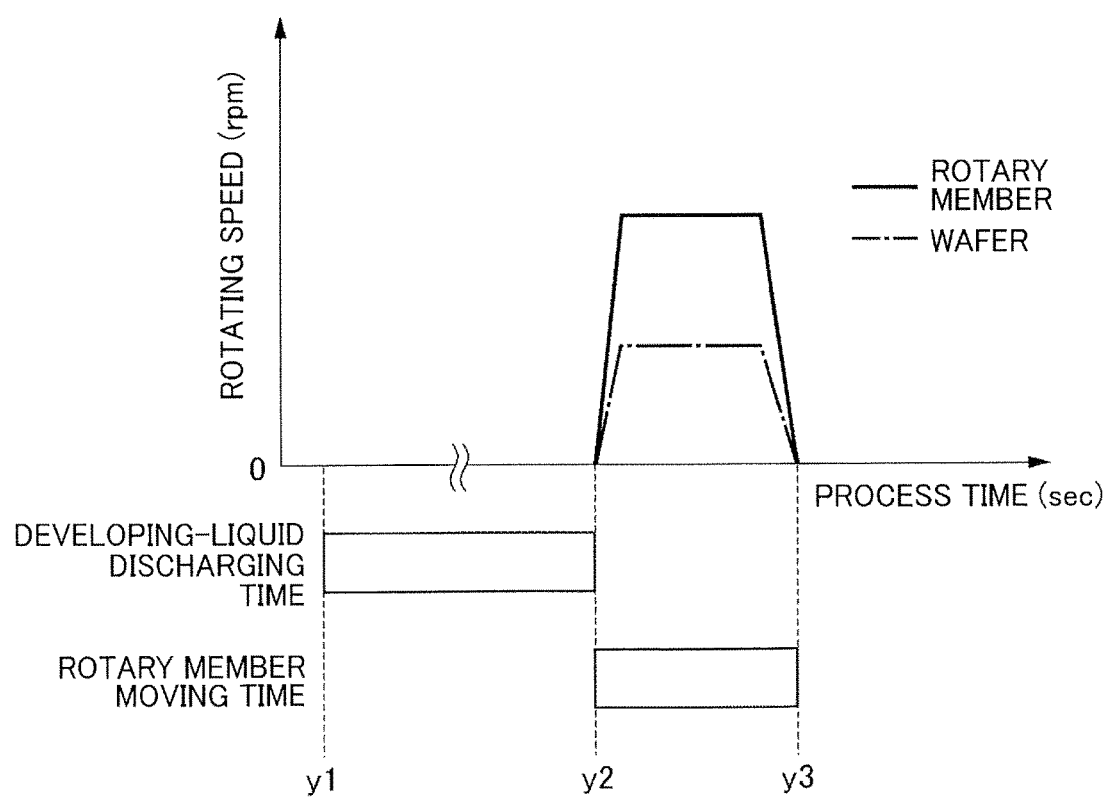
FIG. 46 a time chart of the process steps of FIGS. 43 to 45.

The development processing of the sixth embodiment will now be described with reference to the operation views of the developing apparatus in FIG. 43 to FIG. 45. FIG. 46 is a time chart for the sixth embodiment. Unlike the time chart for each of the foregoing embodiments, this time chart shows the rotating speed of the rotary member 97 by a solid line. Discharge of the developer from the developer nozzle 91 is started first (time point y1 in the chart) and the developer nozzle 91 moves from one end to the other end of a wafer W in a stationary state. The rotary member 97 stands by at a position above a central portion of the wafer W.

When the developer nozzle 91 is located at a position on the other end and the entire surface of the wafer W is coated with the liquid puddle 30 of the developer, the rotary member 97 descends and the lower surface 35 of the rotary member 97 approaches the central portion of the surface of the wafer W. Discharge of the developer from the developer nozzle 91 stops. Concurrently with the stop of the discharge, the rotary member 97 starts rotating counterclockwise in a plan view and the wafer W starts rotating clockwise in a plan view (time point y2). A turning flow is formed in the central part of the wafer W due to the rotation of the rotary member 97 and the developer is stirred in the same manner as that in the foregoing embodiments employing the developer nozzle 31. For example, simultaneously with the start of rotation, the rotary member 97 starts moving along the surface of the wafer W to the peripheral portion of the wafer W.

As a result of the movement of the rotary member 97, the region in which the turning flow is formed in the liquid puddle 30 moves toward the peripheral portion of the wafer W. Then, rotations of the wafer W and the rotary member 97 stop and the movement of the rotary member 97 stops at a position above the peripheral portion of the wafer W (time point y3). Before the stop of rotation of the rotary member 97, the lower surface 35 of the rotary member 97 passes the entire surface of the wafer W and the developer is stirred over the entire surface of the wafer W, in the same manner as in the first embodiment. After lapse of a predetermined period from the stop of the rotation of the rotary member 97, a cleaning liquid is supplied to the wafer W to remove the developer in the same manner as in the first embodiment. Even though the developer is stirred after forming the liquid puddle of the developer over the wafer W as in this sixth embodiment, the developer concentration uniformity in a stirred region becomes higher. Accordingly, the CDU within the plane of the wafer W can be improved.

In the foregoing embodiment, while the rotary member 97 is moved from the central portion to the peripheral portion of the wafer W, the rotary member may also be moved from the peripheral portion to the central portion. The liquid puddle 30 may be formed also by the rotary developing method. That is, a developer nozzle having a diameter of the discharge port smaller than the diameter of the wafer W is moved to change the discharge position of the developer between the central portion and the peripheral portion of the rotating wafer W, by which the liquid puddle 30 may be formed over the entire surface of the wafer W. In such a rotary developing method, in a case where the supply of the developer is started from the central portion of the wafer W and the liquid puddle 30 is formed by moving the supply position to the peripheral portion of the wafer W, the contact time of the wafer W with the developer is shorter according to the proximity to the peripheral portion. In this case, the developing apparatus 9 may also be controlled such that the rotating speed of the rotary member 97 becomes higher according to the proximity to the peripheral portion of the wafer W. The CDU in the plane of the wafer W can be improved by controlling the rotating speed in such a manner.

In the foregoing embodiment, after forming the liquid puddle 30 with the developer nozzle 91, the rotary member 97 is moved along the surface of the wafer W, thereby stirring the developer in the same manner as the first embodiment. Alternatively, the rotary member 97 may be moved along the surface of the wafer W, thereby stirring the developer in the same manner as the developer nozzle 31 in other embodiments. When the developer is stirred in the same manner as in the second or the third embodiments, two rotary members 97 are provided in the developing apparatus.

In the sixth embodiment, the lower surface of the rotary member 97 passes the entire surface of the wafer W so as to improve the CDU in the plane of the wafer, but the developing apparatus 9 need not always be controlled in such a way. For example, an experiment may be conducted to determine whether CDU is lower in the central portion or in the peripheral portion of the wafer W in a case where development is performed using the stationary developing method. Based on the experiment result, the apparatus user may determine whether the central portion or the peripheral portion is to be stirred. If it is determined that the central portion is to be stirred, the liquid puddle 30 is formed as described above and then the rotary member 97 is positioned above the central portion and stirring is performed. In this case, it may not be necessary to rotate the wafer W. On the other hand, if it is determined that the peripheral portion is to be stirred, the rotary member 97 is positioned above the peripheral portion and the developer on the peripheral portion of the wafer W is stirred while rotating the wafer W. As described above, the developer may be stirred locally in the plane of the wafer W to improve the CDU of the wafer at the corresponding portion. However, CDU within the plane of the wafer W can be improved more reliably by stirring the developer over the entire surface of the wafer W as in each of the foregoing embodiments.

<Other Configuration Examples of Nozzle>

Figure 48:
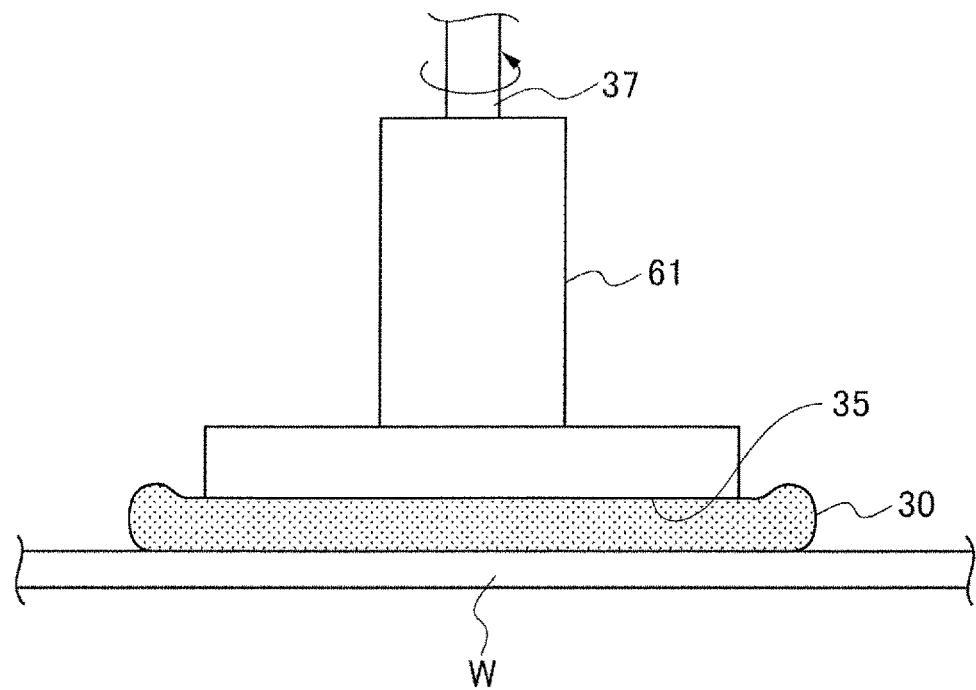
FIG. 48 is a side elevational view of yet another developer nozzle.
Figure 49:
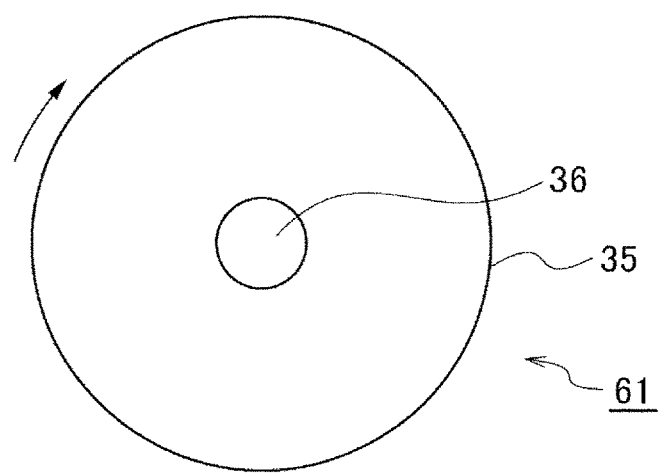
FIG. 49 is a lower plan view of the developer nozzle of FIG. 48.

A developer nozzle used in the each of the foregoing embodiments is not limited to the aforementioned developer nozzle 31. Other configuration examples of the nozzle are described. FIG. 48 shows a side surface of a developer nozzle 61 and FIG. 49 shows a bottom surface 35 of the developer nozzle 61, respectively. The developer nozzle 61 differs from the developer nozzle 31 in that a lower end part of the developer nozzle 61 has a larger diameter so as to form a turning flow in a wider area than the developer nozzle 31.

Figure 50:
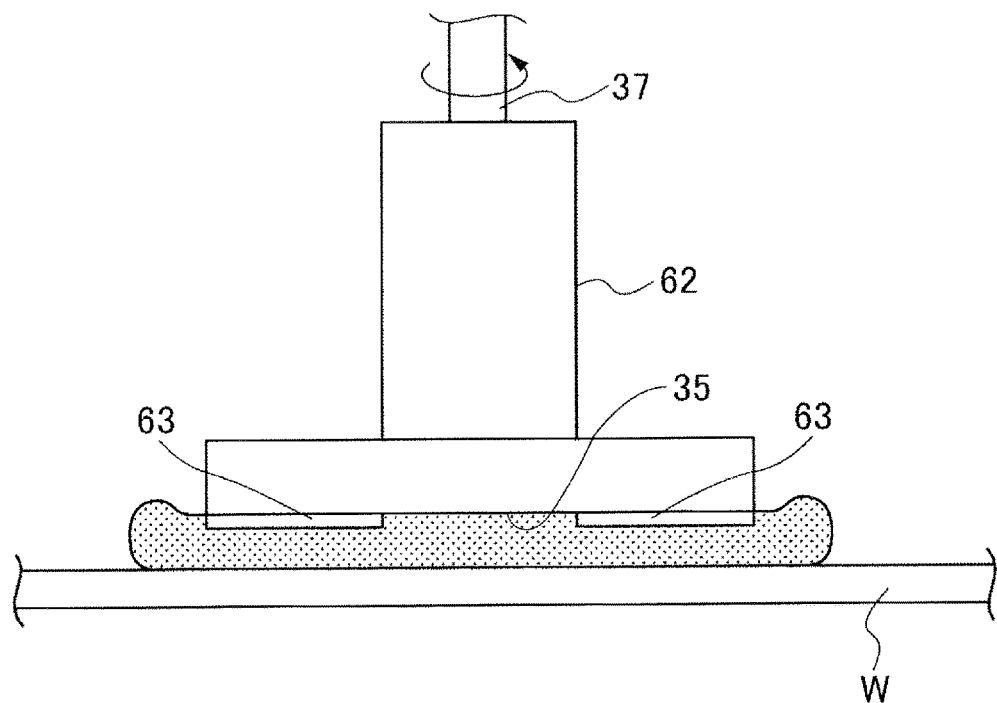
FIG. 50 is a side elevational view of yet another developer nozzle.
Figure 51:
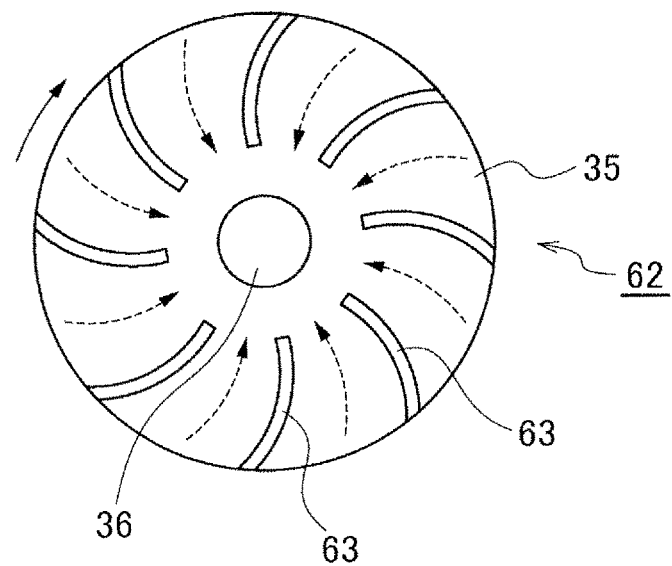
FIG. 51 is a lower plan view of the developer nozzle of FIG. 50.
Figure 52:
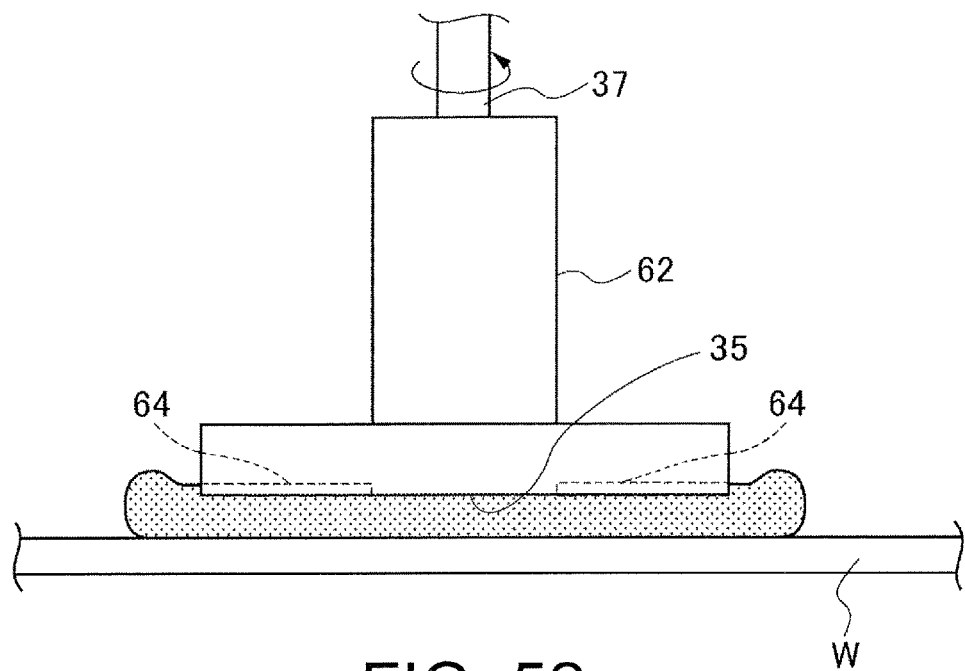
FIG. 52 is a side elevational view of yet another developer nozzle.
Figure 53:
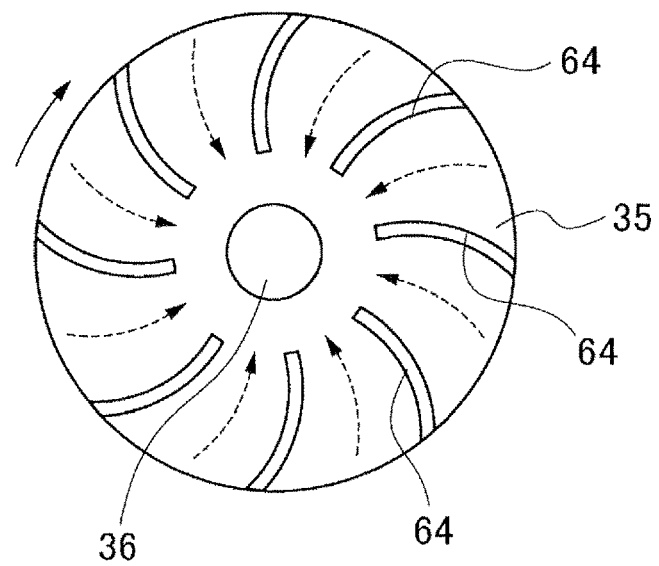
FIG. 53 is a bottom plan view of the developer nozzle of FIG. 52.

Although the bottom surface 35 of the developer nozzle 61 is flat, the configuration thereof is not limited thereto. FIGS. 50 and 51 are a side view and a bottom view of a developer nozzle 62. The developer nozzle 62 has substantially the same configuration as that of the developer nozzle 61, except that the developer nozzle 62 is provided with a projection 63 on the bottom surface 35. A plurality of the projections 63 are arranged at intervals in a circumferential direction of the bottom surface 35. Each projection 63 has an arcuate shape in a plan view extending from a peripheral portion to a central portion of the bottom surface 35. During rotation of the developer nozzle 62, the projections 63 form the flow of the developer flowing toward the central part of the bottom surface 35, whereby the stirring effect is promoted. In FIG. 51, the flow of the developer is shown by the dotted arrows. Since the developer flows toward the central part in this way, the developer is deterred from moving to flow outward of the developer nozzle 62 during rotation of the developer nozzle 62. That is, the developer discharged from the discharge port 36 is held below the developer nozzle 62 for a relatively long time. Accordingly, the developer can be stirred more reliably below the developer nozzle 62, whereby the concentration uniformity can be improved.

Figure 47:
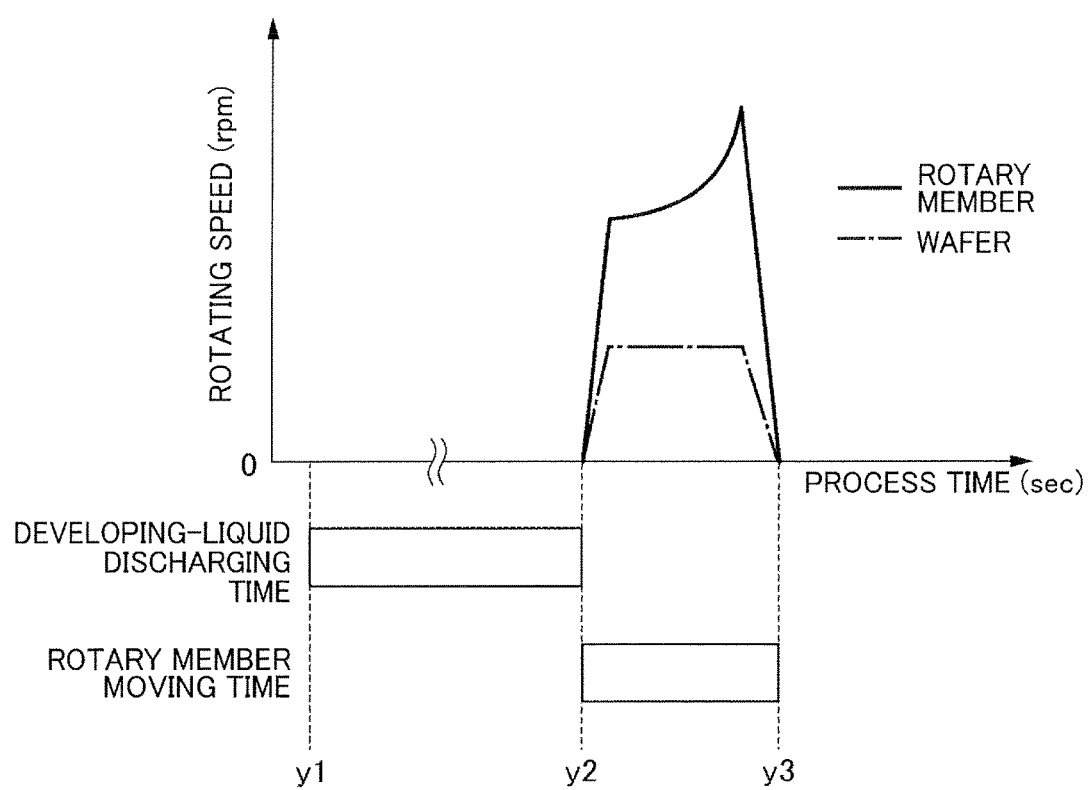
FIG. 47 is a time chart for a modification of the process steps.

In order to form the flow of the developer toward the central portion of the bottom surface 35, grooves may be provided instead of the projection 63. FIGS. 46 and 47 show a side view and a bottom view of the developer nozzle 62 provided with a plurality of grooves 64. Similarly to the projection 63, each groove 64 has an arcuate shape extending from the peripheral part toward the central part of the bottom surface 35. Such projections 63 or grooves 64 may also be provided on the rotary member 97.

Figure 54:
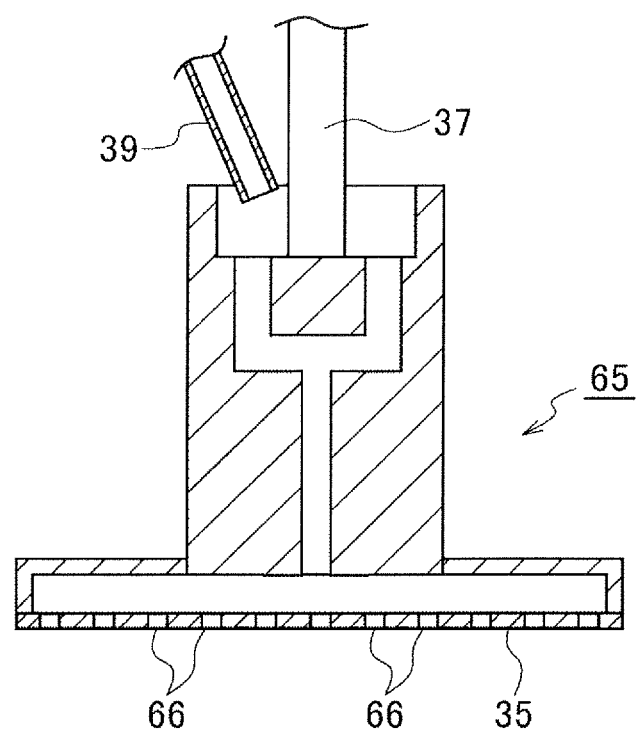
FIG. 54 is a vertical cross sectional view schematically illustrating yet another developer nozzle.
Figure 55:
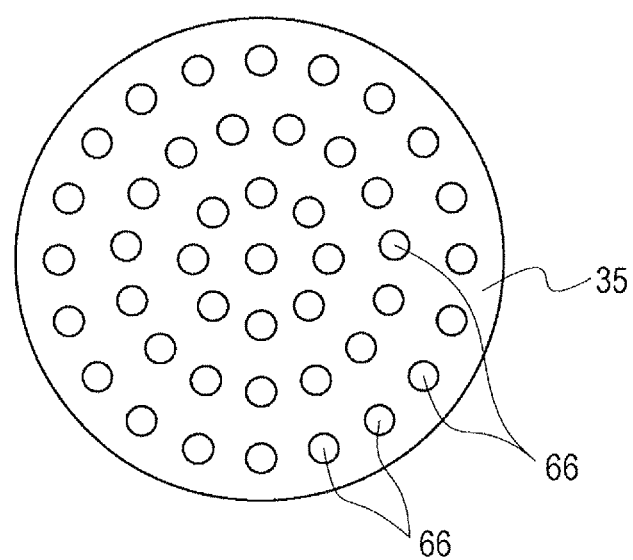
FIG. 55 is a bottom plan view of the developer nozzle of FIG. 54.

FIG. 54 and FIG. 55 are a vertical cross sectional view and a bottom plan view of the developer nozzle 65, respectively. The developer nozzle 65 has substantially the same configuration as that of the developer nozzle 61, except that a number of spaced-apart discharge ports 66 are formed in a bottom surface 35, whereby the developer is supplied to the wafer W like a shower. Since the developer supplied to the developer nozzle 65 is discharged from the respective discharge ports 66 onto the wafer W in a dispersed manner, the discharge pressure of the developer exerted on the wafer W can be suppressed and spattering of the developer on the wafer W can be suppressed more reliably. The spattering can also be suppressed by forming the lower surface 35 of the developer nozzle 65 with a porous material.

Figure 56:
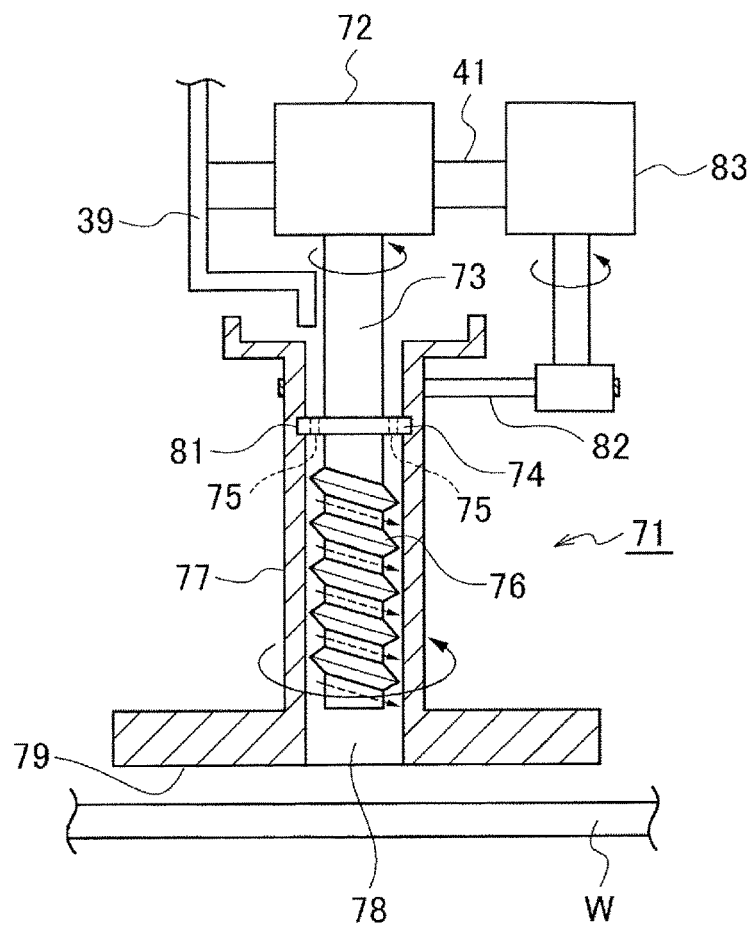
FIG. 56 is a vertical cross sectional view schematically illustrating yet another developer nozzle.
Figure 57:
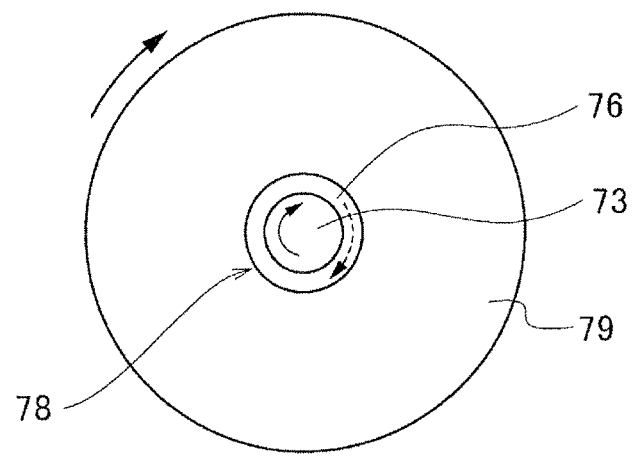
FIG. 57 is a bottom plan view of the developer nozzle of FIG. 56.

A yet another configuration example of the developer nozzle is described. FIG. 56 and FIG. 57 are a longitudinal cross sectional view and a bottom plan view of a developer nozzle 71, respectively. The reference number 72 depicts a flow-path-member rotating mechanism, which is disposed on the arm 41 similarly to the rotating mechanism 38 of the developer nozzle 31. The flow path member rotating mechanism 72 rotates a rotating rod 73, which extends vertically downward, about a central axis thereof. The reference number 74 depicts a flange disposed on the rotating rod 73. Holes 75 serving as developer passages are drilled through the flange 74 and arranged in the circumferential direction. A spiral projection 76 serving as a flow path-forming member is formed on a lower side surface of the rotating rod 73 below the flange 74. Namely, the rotating rod 73 has a screw-like configuration.

A sleeve 77 is disposed close to the projection 76 to surround a side periphery of the rotating rod 73. A lower opening of the sleeve 77 serves as a discharge opening 78 of the developer. Similarly to the developer nozzle 61, the lower end of the sleeve 77 is diametrically enlarged such that the developer in a wide area can be stirred by its rotation. A bottom surface of the sleeve 77 is indicated by the reference number 79. The flange 74 is fitted into a groove 81 formed in the sleeve 77 so as to support the sleeve 77. A belt 82 is wound around the sleeve 77, so that the sleeve 77 is driven by a rotating mechanism 83 disposed on the arm 41. The sleeve 77 can be rotated about a vertical axis by driving the belt 82. The developer supply pipe 39 is disposed on the arm 41 such that the developer is supplied from a downstream end of the developer supply pipe 39 to an upper opening of the sleeve 77.

Similarly to the foregoing developer nozzles, the developer nozzle 71 can form the liquid puddle 30 of the developer on the surface of the wafer W, and can generate a turning flow in the liquid puddle 30. As shown by the solid arrow in FIG. 57, the sleeve 77 and the rotating rod 73 are rotated clockwise as viewed from below, with a bottom surface 79 of the sleeve 77 being close to the wafer W. While the sleeve 77 and the rotating rod 73 are rotated in this manner, the developer is supplied to the upper part of the sleeve 77. As shown by the dotted arrow, the supplied developer turns and flows downward along the projection 76 so as to form a spiral liquid flow. Owing to the rotating rod 73 which is rotating in the circumferential direction of the discharge opening 78, the liquid flow is accelerated and is discharged from the discharge opening 78 onto the wafer W. Thus, the liquid puddle 30 in contact with the bottom surface 79 of the sleeve 77 is formed, and a turning flow is formed in the liquid puddle 30. The turning flow is accelerated by the rotation of the bottom surface 79, so that the developer is remarkably stirred below the bottom surface 79.

In the foregoing embodiment, although the sleeve 77 is rotated in order to promote the stirring operation of the developer, the sleeve 77 need not be rotated. In addition, the rotating rod 73 need not be rotated. That is, a turning flow can be formed in the liquid puddle 30 only by guiding the developer by the projection 76 of the rotating rod 73. A heater, for example, may be embedded in the bottom surfaces of the respective developer nozzles. In this case, when the developer is stirred, the bottom surface may be heated by the heater to a higher temperature, so that the reaction between the developer and the resist can be further promoted.

<Evaluation Test 1>

Figure 58:
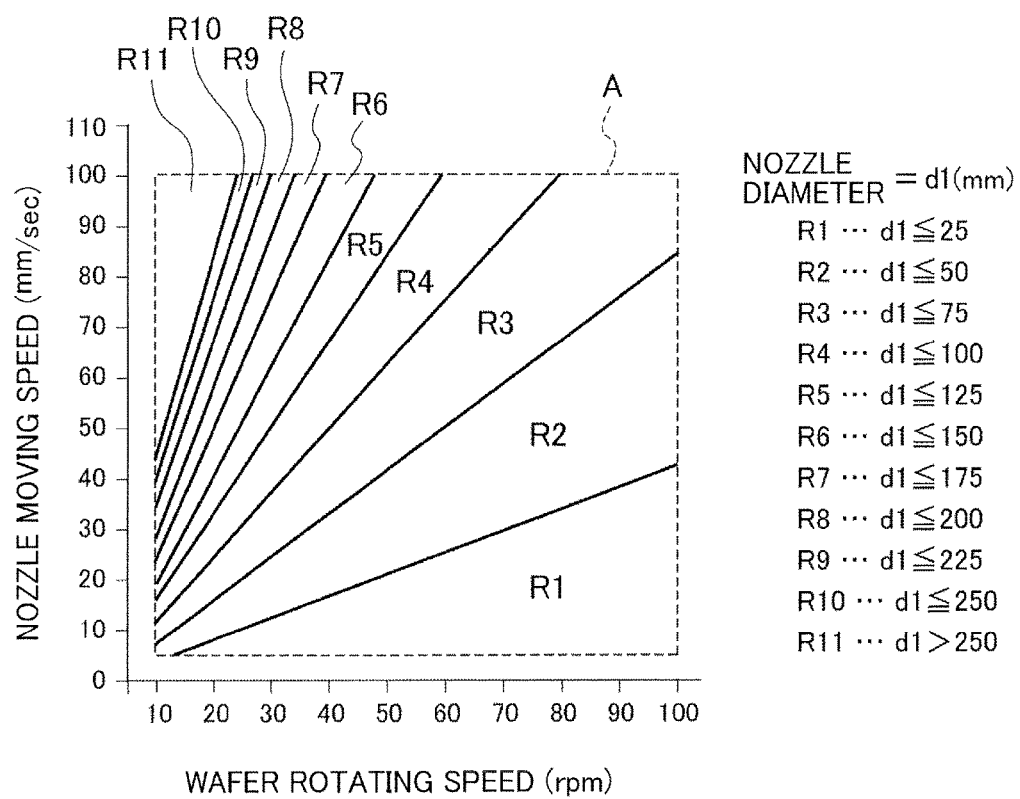
FIG. 58 is a graph showing the result of an evaluation test.

In order to form the liquid puddle 30 on the whole surface of the wafer W in accordance with the first embodiment, there was investigated a relationship among the moving speed of the developer nozzle 31, the rotating speed of the wafer W and the diameter d1 of the bottom surface 35 of the developer nozzle 31, which makes it possible to form a liquid paddle while meeting specific liquid puddle-forming conditions. The liquid puddle-forming conditions are that the interfaces of the liquid puddle(s) 30 merge with each other, and that the bottom surface 35 of the developer nozzle 31 passes through the whole surface of the wafer W (in other words, there is no portions of the surface of the wafer which is not passed through by the trajectory of the vertical projection of the bottom surface 35). FIG. 58 shows a graph showing the result. The axis of abscissa of the graph shows the rotating speed (unit: rpm) of the wafer W, and the axis of ordinate thereof shows the moving speed (unit: mm/second) of the developer nozzle 31. Zone A in the graph surrounded by the chain lines is divided into zones R1 to R11.

As shown in the right side of the graph, each of the zones R1 to R11 correspond to a specific range of the diameter d1 (unit: mm) of the bottom surface 35. For the diameter d1 of the bottom surface of the nozzle corresponding to a specific zone R, the liquid puddle 30 can be formed while meeting the foregoing liquid puddle-forming conditions if the rotating speed of the wafer W and the moving speed of the developer nozzle are set to the values corresponding to the specific zone R shown in the graph.

Figure 59:
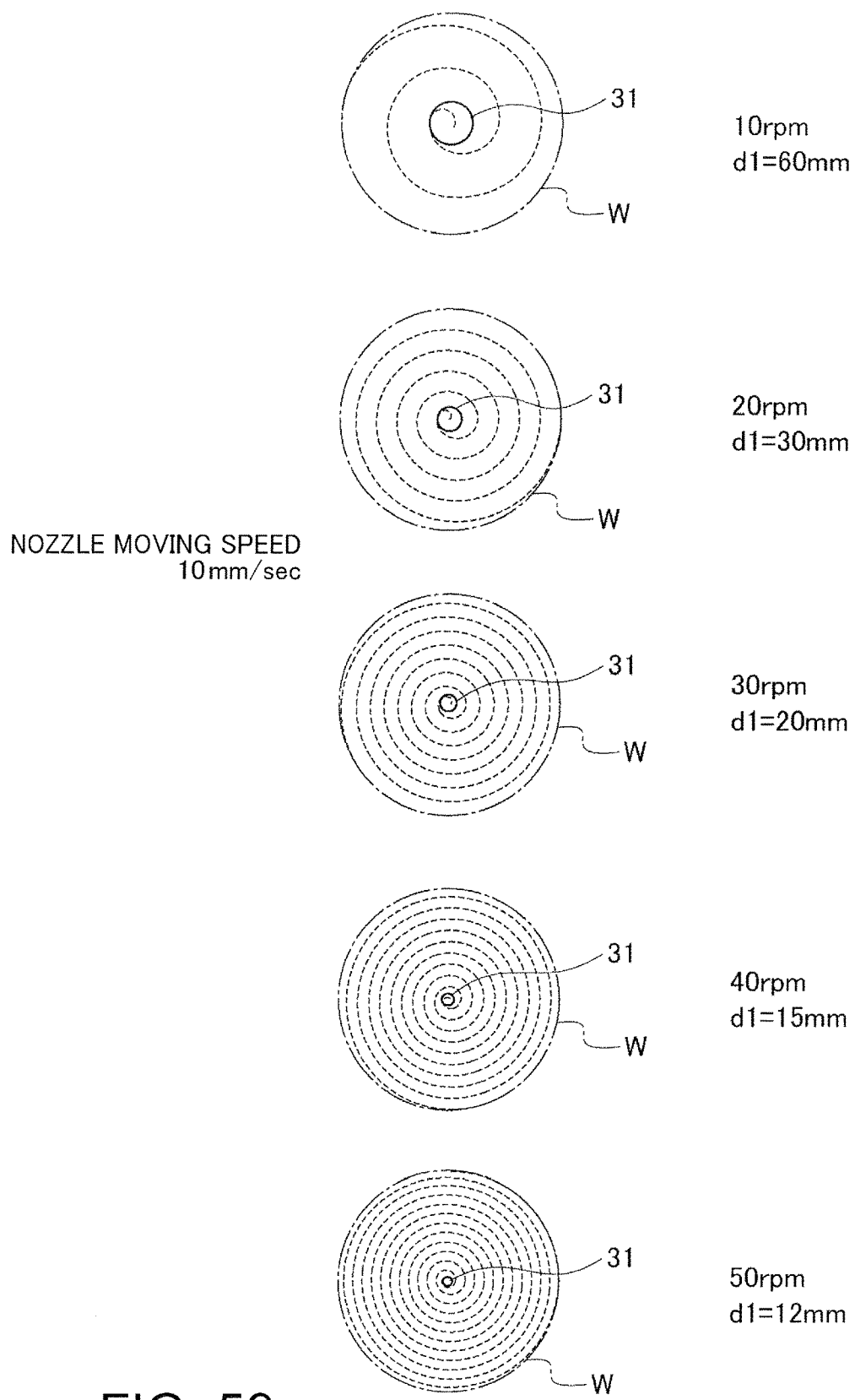
FIG. 59 is a schematic diagram illustrating minimum nozzle diameters and nozzle paths.
Figure 60:
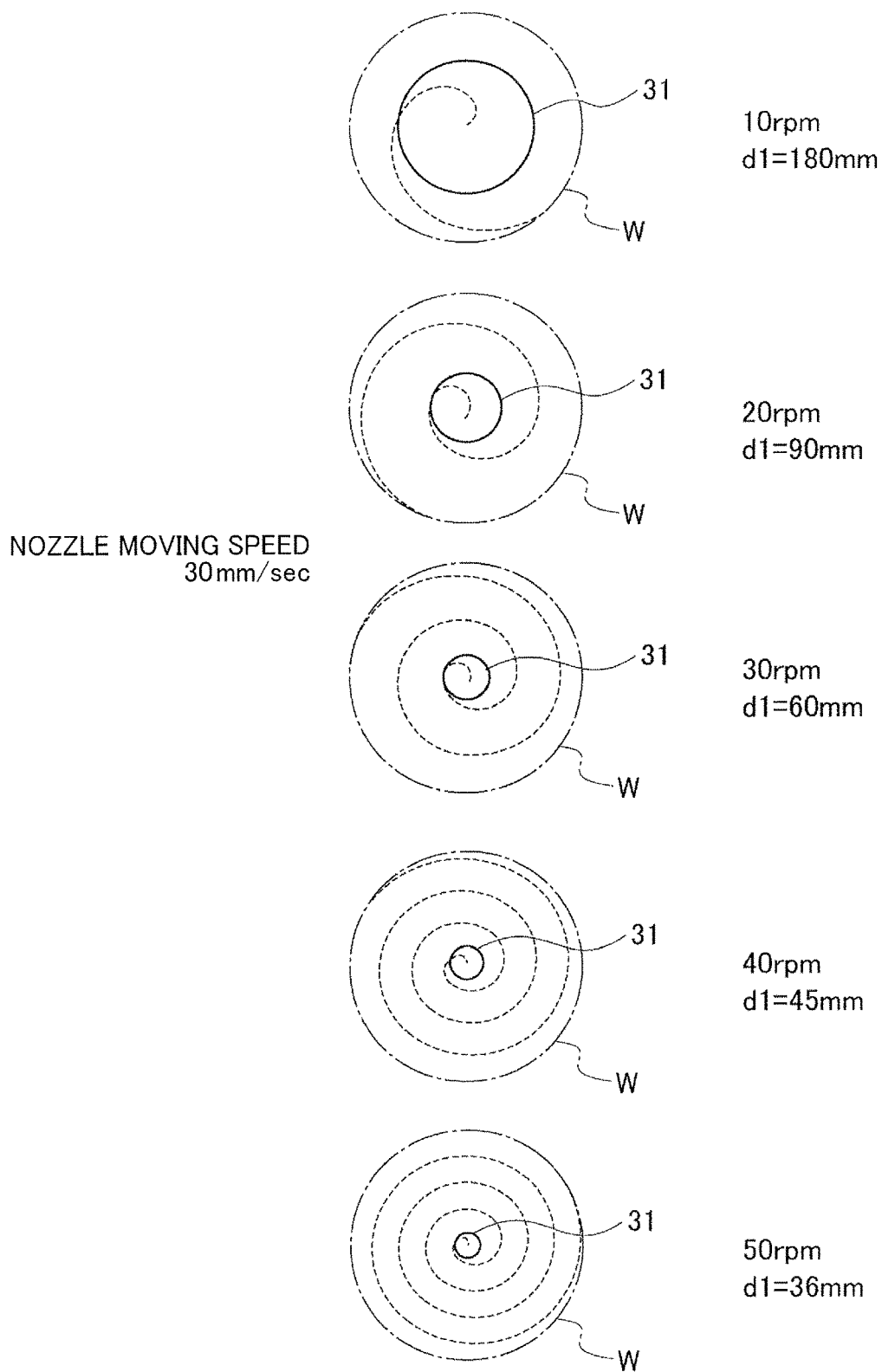
FIG. 60 is a schematic diagram illustrating minimum nozzle diameters and nozzle paths.
Figure 61:
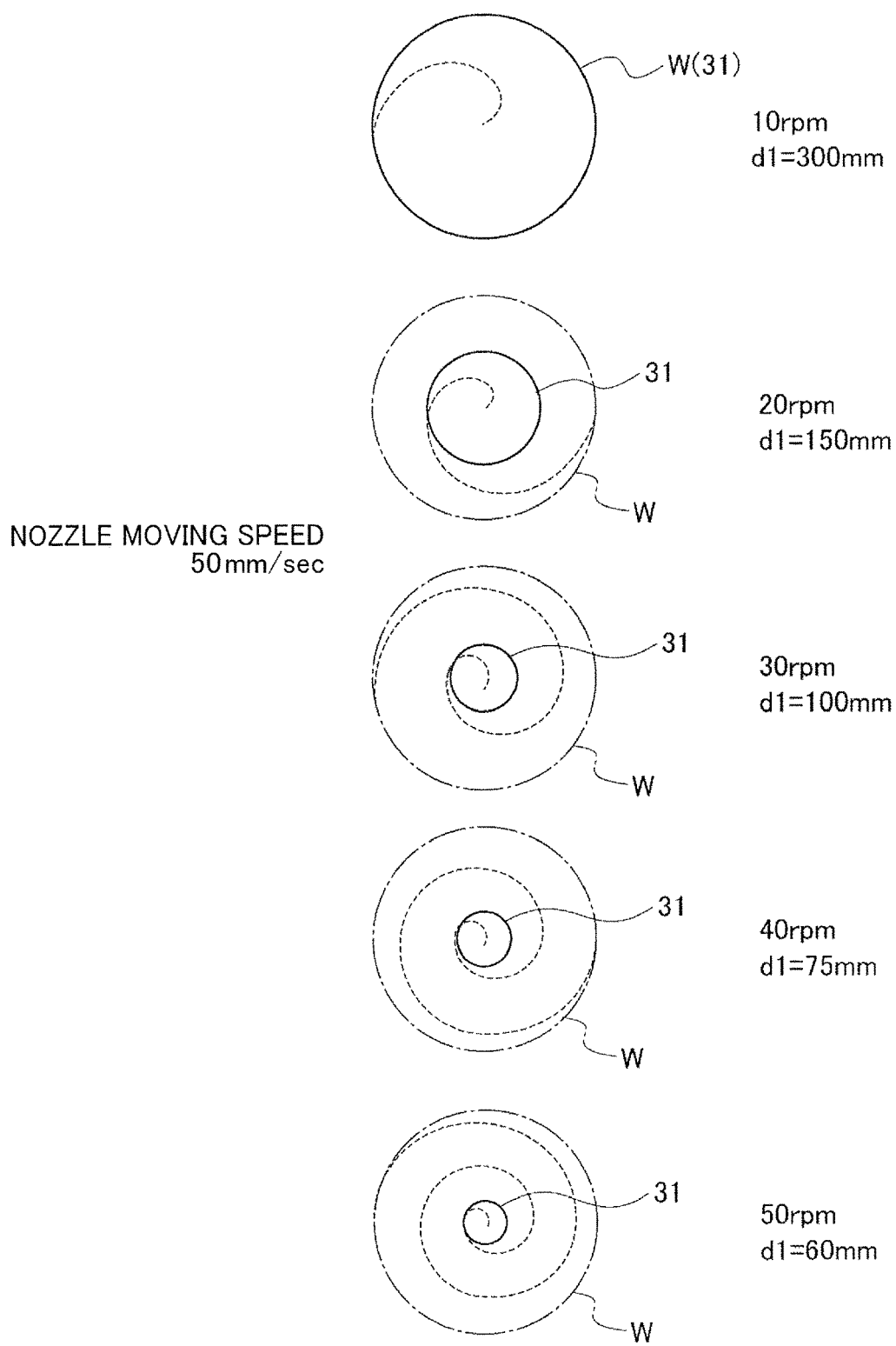
FIG. 61 is a schematic diagram illustrating minimum nozzle diameters and nozzle paths.

When the moving speed of the nozzle and the rotating speed of the wafer W are set as the respective predetermined values, a minimum value (minimum nozzle diameter) of the diameter d1, which makes it possible to form while meeting the foregoing liquid puddle-forming conditions, was calculated. In FIGS. 59, 60, and 61, the minimum nozzle diameters are shown by the solid line circles, when the moving speeds of the nozzle are set as 10 mm/second, 30 mm/second and 50 mm/second, respectively, and trajectories of the center of the bottom surface 35 of the developer nozzle 31 on the wafer W are shown by the dotted lines. In these drawings, five wafers W are shown. The rotating speeds of the wafers W are set as 10 rpm, 20 rpm, 30 rpm, 40 rpm and 50 rpm, in this order from above to below. The diameter of the wafer W shown in FIGS. 59 to 61 is 300 mm.

The calculated minimum nozzle diameters are shown below. If the moving speed of the developer nozzle 31 is 10 mm/second and the rotating speed of the wafer W is 10 rpm, 20, rpm, 30 rpm, 40 rpm or 50 rpm, the minimum nozzle diameter is 60 mm, 30 mm 20 mm, 15 mm or 12 mm. If the moving speed of the developer nozzle 31 is 30 mm/second and the rotating speed of the wafer W is 10 rpm, 20 rpm, 30 rpm, 40 rpm or 50 rpm, the minimum nozzle diameter is 180 mm, 90 mm, 60 mm, 45 mm or 36 mm. If the moving speed of the developer nozzle 31 is 50 mm/second and the rotating speed of the wafer W is 10 rpm, 20 rpm, 30 rpm, 40 rpm or 50 rpm, the minimum nozzle diameter is 300 mm, 150 mm, 100 mm, 75 mm or 60 mm.

Although not illustrated, the minimum nozzle diameters in the cases where the moving speed of the nozzle is 20 mm/second or 40 mm/second were also calculated. If the moving speed of the nozzle is 20 mm/second and the rotating speed of the wafer W is 10 rpm, 20 rpm, 30 rpm, 40 rpm or 50 rpm, the minimum nozzle diameter is 120 mm, 60 mm, 40 mm 30 mm or 20 mm. If the moving speed of the nozzle is 40 mm/second and the rotating speed of the wafer W is 10 rpm, 20 rpm, 30 rpm, 40 rpm or 50 rpm, the minimum nozzle diameter is 240 mm, 120 mm, 80 mm, 60 mm or 48 mm, respectively.

The graph of FIG. 58 will be explained again. As shown in the graph, by suitably setting the rotating speed of the wafer W, the moving speed of the developer nozzle 31, and the diameter of the bottom surface of the developer nozzle 31, the liquid puddle 30 can be formed meeting the foregoing liquid puddle-forming conditions. Note that, as described in the first embodiment, the rotating speed of the wafer W is preferably not more than 50 rpm, for example.

<Evaluation Test 2>

With the use of an evaluation apparatus, a test was conducted to investigate whether the developer can be stirred by applying an action for rotating the liquid puddle. The evaluation apparatus includes a circular lower plate and a circular upper plate. The lower plate and the upper plate are opposed to each other, and the upper plate is configured to be rotated about a center axis thereof. A liquid was supplied to a space between the lower plate and the upper plate to form a liquid puddle. It was examined that whether or not liquid flow was generated in the upper portion and the lower portion of the liquid puddle, when the upper plate was rotated. In this apparatus, the space between the upper plate and the lower plate can be varied, so that a liquid thickness of the space is adjustable. The tests were conducted plural times, while changing the liquid thickness and the rotating speed of the upper plate. The contact angle of the upper surface of the lower plate against the liquid was 77.3°, and the contact angle of the lower surface of the upper plate against the liquid was 91.3°.

Table 1 below shows the result of the evaluation test 2. The flowing condition of the liquid is shown by three degrees (∘: Good Δ: Acceptable x: Unacceptable) for the upper surface and the lower surface. From Table 1, it can be understood that, when the liquid thickness is not more than 1.0 mm, the liquid flows are generated in the upper surface and the lower surface of the liquid puddle. Namely, the liquid is stirred. With the liquid thickness being not more than 1.0 mm, particularly when the rotating speed of the upper plate is set not less than 60 rpm, the good liquid flows are generated in the upper surface and the lower surface of the liquid puddle. From the result of the evaluation test 2, by suitably setting a height of the wafer W and a height of the bottom surface of the developer nozzle 31, it can be estimated that a turning flow can be generated to stir the developer, as described above.

TABLE 1

| Liquid Thickness | | 15 rpm | 60 rpm | 240 to 300 rpm |
|---|---|---|---|---|
| 2.5 mm | Top Surface | ∘ | ∘ | ∘ |
| | Bottom Surface | x | Δ | Δ |
| 1.75 mm | Top Surface | ∘ | ∘ | ∘ |
| | Bottom Surface | x | Δ | ∘ |
| 1.0 mm | Top Surface | ∘ | ∘ | ∘ |
| | Bottom Surface | Δ | ∘ | ∘ |
| 0.75 mm | Top Surface | ∘ | ∘ | ∘ |
| | Bottom Surface | Δ | ∘ | ∘ |

The invention claimed is:

1. A developing method comprising:
holding a substrate horizontally by a substrate holder;
supplying a developer from at least one developer nozzle to a surface of the substrate thereby forming thereon a liquid puddle;
generating a turning flow in the liquid puddle to stir the liquid puddle; and
moving a position where the turning flow is generated,
wherein the generating of the turning flow and the moving of the position of the turning flow include:
rotating first and second rotary members in parallel to each other along the surface of the substrate while the rotary members are being in contact with the liquid puddle at positions different from each other, in which the first rotary member moves from a central part to a peripheral edge of the substrate while generating a turning flow in the liquid puddle, and the second rotary member moves concurrently with the movement of the first rotary member from a position, which is closer to the peripheral edge of the substrate than the central part of the substrate, toward the peripheral edge while generating a turning flow in the liquid puddle.

2. The developing method according to claim 1, wherein the moving of the position where the turning flow was generated is performed while rotating the substrate holder.

3. The developing method according to claim 2, wherein a turning direction of the turning flow is opposite to a rotating direction of the substrate.

4. The developing method according to claim 1, wherein the turning flow is generated while supplying the developer from the at least one developer nozzle to the substrate and forming the liquid puddle of the developer.

5. The developing method according to claim 1, wherein each of the rotary members has a surface portion that rotates along the surface of the substrate while the surface portion is opposing the substrate.

6. The developing method according to claim 5, wherein the developer is supplied by a first developer nozzle and a second developer nozzle, and wherein the first rotary member rotates about a discharge port of the first developer nozzle and the second rotary member rotates about a discharge port of the second developer nozzle.

7. The developing method according to claim 1, wherein the turning flow is generated in the liquid puddle after the liquid puddle is formed over the entire substrate using the at least one developer nozzle.

8. A non-transitory storage medium for storing a computer program used in a developing apparatus for performing development processing on the substrate after exposure, wherein the computer program executes the developing method according to claim 1.

* * * * *